US012648422B2

(12) United States Patent
Lee et al.

(10) Patent No.: US 12,648,422 B2
(45) Date of Patent: Jun. 2, 2026

(54) SEMICONDUCTOR DEVICE INCLUDING INTERCONNECTION STRUCTURE

(71) Applicant: SAMSUNG ELECTRONICS CO., LTD., Suwon-si (KR)

(72) Inventors: Yanghee Lee, Suwon-si (KR); Byoungho Kwon, Suwon-si (KR); Jonghyuk Park, Suwon-si (KR); Boun Yoon, Suwon-si (KR); Ilyoung Yoon, Suwon-si (KR); Seokjun Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 283 days.

(21) Appl. No.: 18/217,724

(22) Filed: Jul. 3, 2023

(65) Prior Publication Data

US 2024/0014068 A1     Jan. 11, 2024

(30) Foreign Application Priority Data

Jul. 5, 2022    (KR) ........................ 10-2022-0082712

(51) Int. Cl.
*H01L 21/768* (2006.01)
*H01L 23/522* (2006.01)
(Continued)

(52) U.S. Cl.
CPC .. *H01L 21/76832* (2013.01); *H01L 21/76816* (2013.01); *H01L 21/76877* (2013.01);
(Continued)

(58) Field of Classification Search
CPC ......... H01L 21/76832; H01L 21/76816; H01L 21/76877; H01L 23/5222; H01L 23/5226;
(Continued)

(56) References Cited

U.S. PATENT DOCUMENTS 9,520,321 B2    12/2016   Ryan et al.
9,530,691 B1    12/2016   Zhang et al.
(Continued)

FOREIGN PATENT DOCUMENTS

KR        1020080011495 A      2/2008
KR        1020180030280 A      3/2018
KR        1020200001440 A      1/2020

*Primary Examiner* — Karen Kusumakar
(74) *Attorney, Agent, or Firm* — Muir Patent Law, PLLC

(57) ABSTRACT

A semiconductor device includes a lower structure; an intermediate insulating structure on the lower structure; an intermediate interconnection structure penetrating through the intermediate insulating structure; an upper insulating structure on the intermediate insulating structure and the intermediate interconnection structure; and an upper conductive pattern penetrating through the upper insulating structure and electrically connected to the intermediate interconnection structure, wherein the intermediate insulating structure includes an intermediate etch-stop layer and an intermediate insulating layer thereon, the intermediate insulating layer includes first and second intermediate material layers, the second intermediate material layer having an upper surface coplanar with an upper surface of the first intermediate material layer, the intermediate interconnection structure penetrates through the first intermediate material layer and the intermediate etch-stop layer, and a material of the first intermediate material layer has a dielectric constant that is higher than a dielectric constant of a material of the second intermediate material layer.

20 Claims, 20 Drawing Sheets

(51) Int. Cl.
_H01L 23/532_ (2006.01)
_H10B 12/00_ (2023.01)

(52) U.S. Cl.
CPC ...... _H01L 23/5222_ (2013.01); _H01L 23/5226_ (2013.01); _H01L 23/53238_ (2013.01); _H01L 23/53266_ (2013.01); _H01L 23/53295_ (2013.01); _H10B 12/315_ (2023.02)

(58) Field of Classification Search
CPC ......... H01L 23/53238; H01L 23/53266; H01L 23/53295; H01L 21/76807; H01L 21/76835; H01L 23/5386; H01L 23/5283; H01L 23/535; H10B 12/315; H10B 12/053; H10B 12/50; H10B 12/48
See application file for complete search history.

(56) References Cited

U.S. PATENT DOCUMENTS

| | | | |
|---|---|---|---|
| 10,170,411 B2 | 1/2019 | Briggs et al. | |
| 10,727,123 B2 | 7/2020 | Lai et al. | |
| 2019/0363048 A1 | 11/2019 | Zhao et al. | |
| 2021/0098290 A1 | 4/2021 | Hsueh et al. | |
| 2021/0134883 A1* | 5/2021 | Dutta | H01L 23/53295 |
| 2021/0257248 A1* | 8/2021 | Chang | H01L 23/5226 |
| 2022/0068794 A1 | 3/2022 | Welsh et al. | |
| 2022/0115379 A1 | 4/2022 | Lee et al. | |
| 2022/0254715 A1* | 8/2022 | Stamper | H01L 21/76885 |

* cited by examiner

SEMICONDUCTOR DEVICE INCLUDING INTERCONNECTION STRUCTURE

CROSS-REFERENCE TO RELATED APPLICATION(S)

This application claims benefit of priority to Korean Patent Application No. 10-2022-0082712 filed on Jul. 5, 2022, in the Korean Intellectual Property Office, the disclosure of which is incorporated herein by reference in its entirety.

BACKGROUND

1. Field

Embodiments relate to a semiconductor device including an interconnection structure.

2. Description of the Related Art

In order to reduce RC delay of interconnections due to parasitic capacitance between the interconnections, a low dielectric may be used as an interlayer insulating layer.

SUMMARY

The embodiments may be realized by providing a semiconductor device including a lower structure; an intermediate insulating structure on the lower structure; an intermediate interconnection structure penetrating through the intermediate insulating structure; an upper insulating structure on the intermediate insulating structure and the intermediate interconnection structure; and an upper conductive pattern penetrating through the upper insulating structure and electrically connected to the intermediate interconnection structure, wherein the intermediate insulating structure includes an intermediate etch-stop layer and an intermediate insulating layer on the intermediate etch-stop layer, the intermediate insulating layer includes a first intermediate material layer and a second intermediate material layer, the second intermediate material layer having an upper surface coplanar with an upper surface of the first intermediate material layer, the intermediate interconnection structure penetrates through the first intermediate material layer and the intermediate etch-stop layer, and a material of the first intermediate material layer has a dielectric constant that is higher than a dielectric constant of a material of the second intermediate material layer.

The embodiments may be realized by providing a semiconductor device including a lower structure; a first etch-stop layer on the lower structure, the first etch-stop layer having a first portion and a second portion; a first material layer on the first portion of the first etch-stop layer; a second material layer on the second portion of the first etch-stop layer; an interconnection structure penetrating through the first material layer and the first portion of the first etch-stop layer; a second etch-stop layer on the first material layer, the second material layer, and the interconnection structure; an upper insulating layer on the second etch-stop layer; and an upper conductive pattern penetrating through the upper insulating layer and the second etch-stop layer and electrically connected to the interconnection structure, wherein the first portion of the first etch-stop layer has a thickness that is different from a thickness of the second portion of the first etch-stop layer, and a material of the first material layer is different from a material of the second material layer.

The embodiments may be realized by providing a semiconductor device including a first lower insulating structure; a first lower interconnection structure penetrating through the first lower insulating structure; a second lower insulating structure on the first lower insulating structure and the first lower interconnection structure; a second lower interconnection structure penetrating through the second lower insulating structure; an intermediate insulating structure on the second lower insulating structure and the second lower interconnection structure; an intermediate interconnection structure penetrating through the intermediate insulating structure; an upper insulating structure on the intermediate insulating structure and the intermediate interconnection structure; and an upper conductive pattern penetrating through the upper insulating structure, wherein the intermediate insulating structure includes an intermediate etch-stop layer and an intermediate insulating layer on the intermediate etch-stop layer, the intermediate insulating layer includes a first intermediate material layer and a second intermediate material layer, the second intermediate material layer having an upper surface coplanar with an upper surface of the first intermediate material layer, the intermediate etch-stop layer includes a first portion in contact with the first intermediate material layer, and a second portion in contact with the second intermediate material layer, the intermediate interconnection structure penetrates through the first intermediate material layer and the intermediate etch-stop layer and is electrically connected to the second lower interconnection structure, and the first portion of the intermediate etch-stop layer has a thickness that is different from a thickness of the second portion of the intermediate etch-stop layer.

BRIEF DESCRIPTION OF DRAWINGS

Features will be apparent to those of skill in the art by describing in detail exemplary embodiments with reference to the attached drawings in which.

DETAILED DESCRIPTION

Hereinafter, terms such as "upper", "middle", "lower", and the like, are replaced with other terms, for example, terms such as "first", "second", "third", and the like, and may be used to describe the elements of the specification. Terms such as "first", "second" and "third" may be used to describe various elements, but the elements are not limited by the terms, and a "first element" may be referred to as a "second element". For example, as used herein, the terms "first," "second," and the like are merely for identification and differentiation, and are not intended to imply or require sequential inclusion (e.g., a third element and a fourth element may be described without implying or requiring the presence of a first element or second element). Hereinafter, embodiments of the present disclosure will be described as follows with reference to the accompanying drawings.

Figure 1:
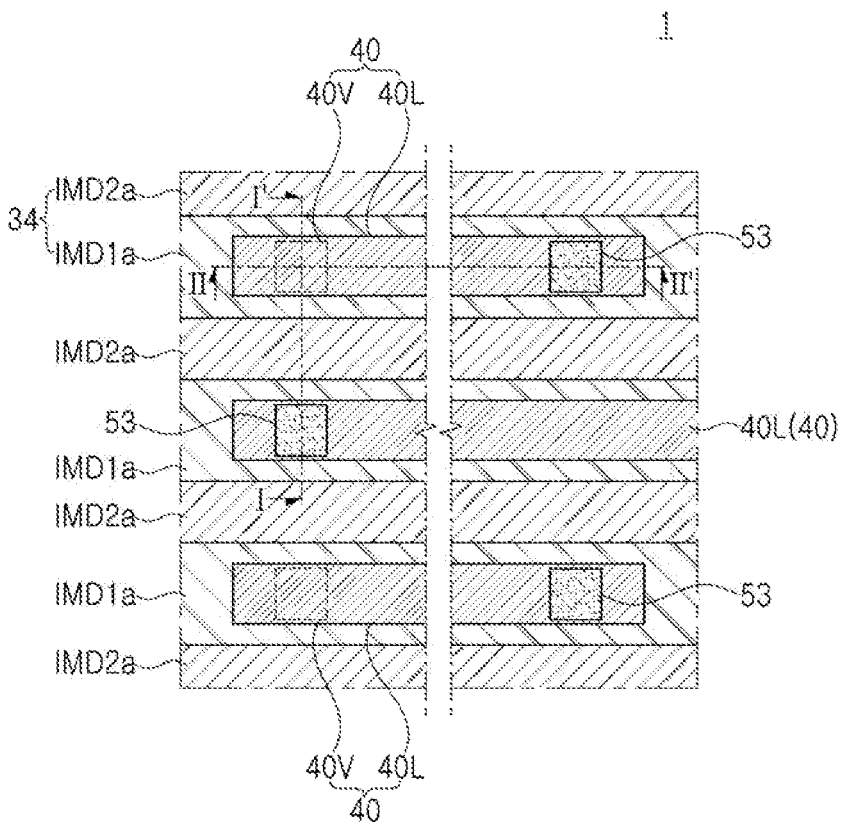
FIGS. 1, 2A, and 2B are diagrams schematically illustrating a semiconductor device according to an example embodiment.
Figure 2A:
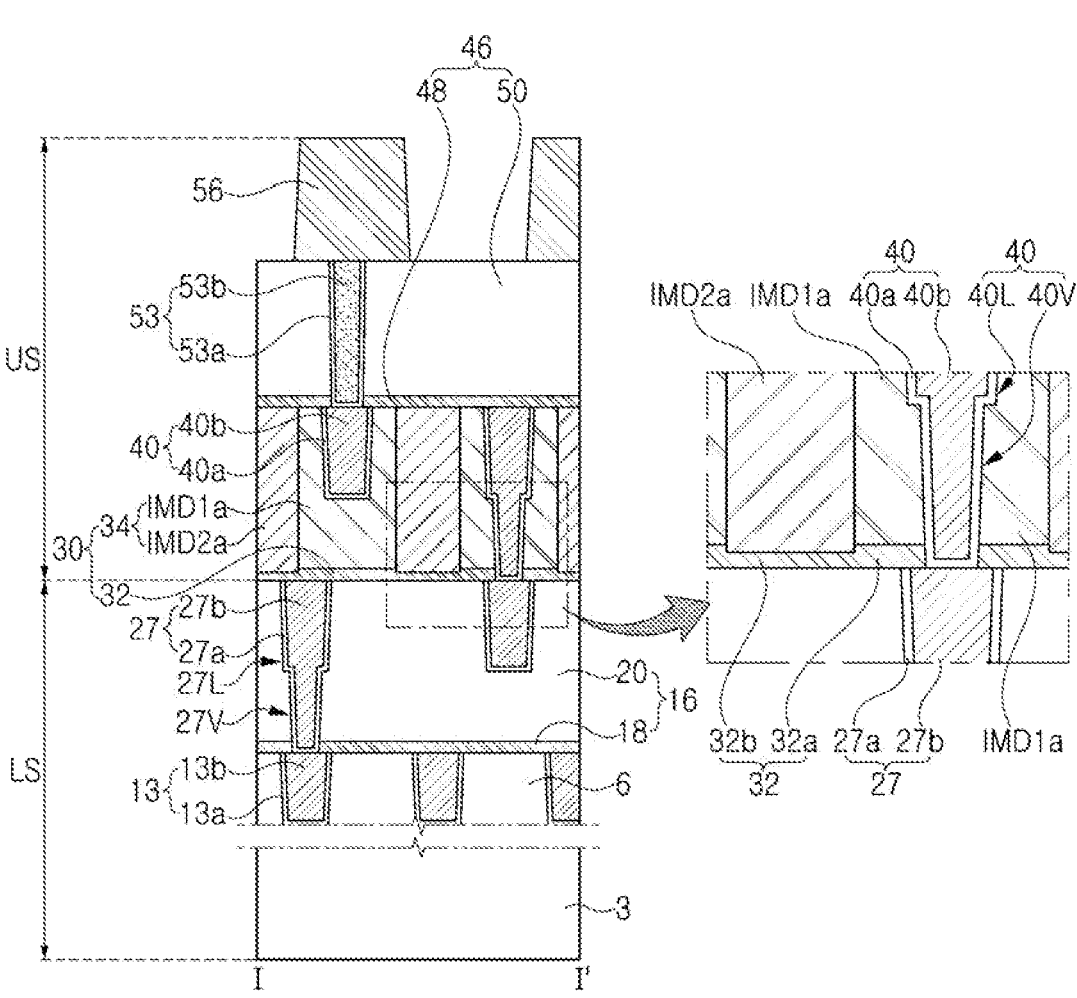
Figure 2B:
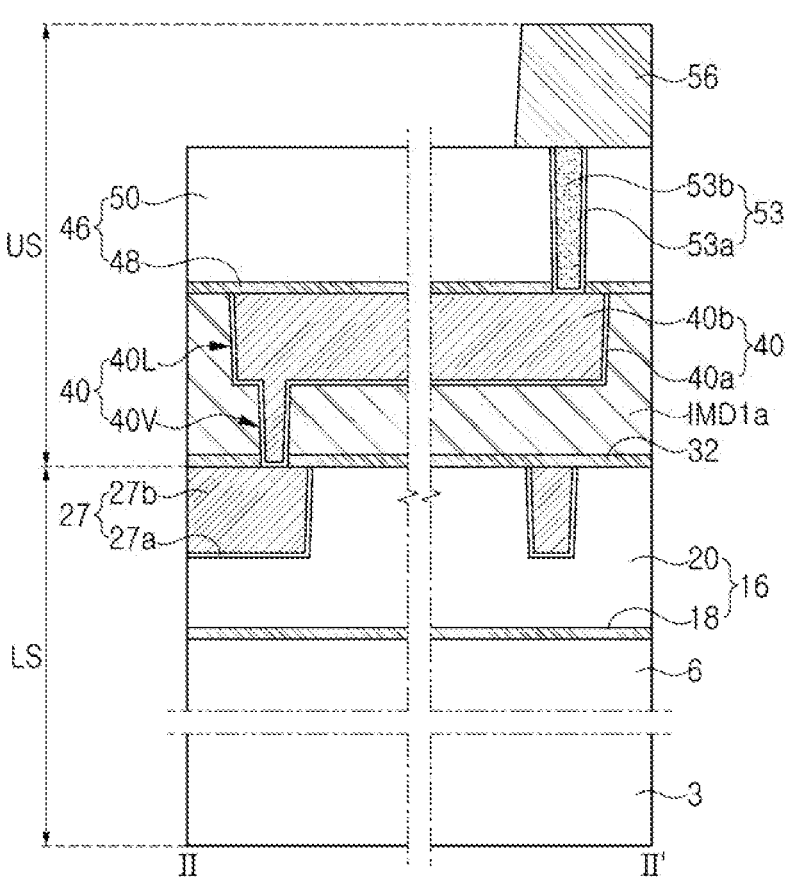

An embodiment of a semiconductor device will be described with reference to FIGS. 1, 2A and 2B. FIGS. 1, 2A and 2B are diagrams schematically illustrating a semiconductor device according to an example embodiment. FIG. 1 is a top view of a semiconductor device according to an embodiment, FIG. 2A is a cross-sectional view schematically illustrating a region taken along line I-I' of FIG. 1, and FIG. 2B is a cross-sectional view schematically illustrating a region taken along the line II-II' of FIG. 1.

Referring to FIGS. 1, 2A, and 2B, a semiconductor device 1 according to an example embodiment may include a lower structure LS and an upper structure US on the lower structure LS.

The lower structure LS may include a base 3, a first lower insulating layer 6 on the base 3, and a first lower interconnection structure 13 penetrating through the first lower insulating layer 6.

The first lower insulating layer 6 may include, e.g., silicon oxide or a low-κ dielectric. In an implementation, the first lower insulating layer 6 may be referred to as a first lower insulating structure.

The first lower interconnection structure 13 may include an interconnection material layer 13b and a barrier material layer 13a covering a side surface and a bottom surface of the interconnection material layer 13b. In an implementation, the interconnection material layer 13b may include, e.g., copper (Cu), and the barrier material layer 13a may include, e.g., Ti, TiN, or TaN. As used herein, the term "or" is not an exclusive term, e.g., "A or B" would include A, B, or A and B.

The lower structure LS may further include a lower insulating structure 16 on the first lower insulating layer 6 and the first lower interconnection structure 13 and a second lower interconnection structure 27 in the lower insulating structure 16. The second lower interconnection structure 27 may penetrate through the lower insulating structure 16.

The lower insulating structure 16 may include a lower etch-stop layer 18 and a second lower insulating layer 20 on the lower etch-stop layer 18. The second lower insulating layer 20 may be in contact (e.g., direct contact) with a side surface of the second lower interconnection structure 27.

The lower etch-stop layer 18 may be formed of an insulating material including, e.g., SiN, SiBN, or SiCN. The second lower insulating layer 20 may include, e.g., silicon oxide or a low-κ dielectric.

The second lower interconnection structure 27 may include an interconnection material layer 27b and a barrier material layer 27a covering a side surface and a bottom surface of the interconnection material layer 27b. The second lower interconnection structure 27 may include a lower interconnection portion 27L and a lower via portion 27V extending downwardly from the lower interconnection portion 27L. In an implementation, the interconnection material layer 27b may include, e.g., Cu, and the barrier material layer 27a may include, e.g., Ti, Ta, TiN, or TaN.

The upper structure US may include an intermediate insulating structure 30 and an intermediate interconnection structure 40 in the intermediate insulating structure 30.

The intermediate insulating structure 30 may include an intermediate etch-stop layer 32 on the lower structure LS and an intermediate insulating layer 34 on the intermediate etch-stop layer 32.

The intermediate insulating layer 34 may include a first intermediate material layer IMD1a and a second intermediate material layer IMD2a, in contact with each other. The first intermediate material layer IMD1a may have an upper surface coplanar with an upper of the second intermediate material layer IMD2a.

A material of the first intermediate material layer IMD1a may have a dielectric constant that is higher than a dielectric constant of a material of the second intermediate material layer IMD2a.

The first intermediate material layer IMD1a may be formed of a material having hardness greater than that of the second intermediate material layer IMD2a. In an implementation, the second intermediate material layer IMD2a may be more porous than the first intermediate material layer IMD1a.

The material of the first intermediate material layer IMD1a may include, e.g., silicon oxide, and the material of the second intermediate material layer IMD2a may include, e.g., a low dielectric having a dielectric constant that is lower than a dielectric constant of the silicon oxide.

In an implementation, the first intermediate material layer IMD1a may include, e.g., TetraEthylOrthoSilicate (TEOS) oxide, and the second intermediate material layer IMD2a may include, e.g., SiOCH or SiOC, having a dielectric constant lower than that of the TEOS oxide.

The material of the first intermediate material layer IMD1a and the material of the second intermediate material layer IMD2a may be low dielectrics having a dielectric constant lower than 3.9. In an implementation, the material of the first intermediate material layer IMD1a may be a first low dielectric, and the material of the second intermediate material layer IMD2a may be a second low dielectric having a dielectric constant that is lower than that of the first low dielectric.

The intermediate interconnection structure 40 may include an intermediate interconnection material layer 40b and an intermediate barrier material layer 40a covering a side surface and a bottom surface of the intermediate interconnection material layer 40b. The intermediate interconnection structure 40 may include an intermediate interconnection portion 40L and an intermediate via portion 40V extending downwardly from the intermediate interconnection portion 40L. The intermediate interconnection material layer 40b may include, e.g., Cu, and the intermediate barrier material layer 40a may include at least one of Ti, Ta, TiN, and TaN.

The first intermediate material layer IMD1a may cover a lower surface and a side surface of the intermediate interconnection portion 40L, and the intermediate via portion 40V may extend downwardly from a portion of the lower surface of the intermediate interconnection portion 40L to penetrate through the first intermediate material layer IMD1a and the intermediate etch-stop layer 32 below the intermediate interconnection portion 40L.

The intermediate etch-stop layer 32 may include a first portion 32a (vertically overlapping the first intermediate material layer IMD1a and in contact with the first intermediate material layer IMD1a) and a second portion 32b (vertically overlapping the second intermediate material layer IMD2a and in contact with the second intermediate material layer IMD2a).

A thickness of the first portion 32a may be greater than a thickness of the second portion 32b (e.g., as measured in a vertical direction).

The upper structure US may further include an upper insulating structure 46 and an upper conductive pattern 53 penetrating through the upper insulating structure 46.

The upper insulating structure 46 may include an upper etch-stop layer 48 covering the intermediate insulating structure 30 and the intermediate interconnection structure 40, and an upper insulating layer 50 on the upper etch-stop layer 48. The upper conductive pattern 53 may include a plug pattern 53b and a barrier layer 53a covering a side surface and a bottom surface of the plug pattern 53b. The plug pattern 53b may include, e.g., tungsten (W), and the barrier layer 53a may include, e.g., Ti, Ta, TiN, or TaN.

The upper structure US may further include an upper interconnection 56 electrically connected to the upper conductive pattern 53 on the upper insulating structure 46. The upper interconnection 56 may include a conductive material, different from the intermediate interconnection structure 40, e.g., Al or W, or other than copper.

Hereinafter, various modified examples of the elements of the above-described embodiment will be described. Various modifications of the elements of the above-described embodiment described below will be mainly described with respect to the elements to be modified or the elements to be replaced. In addition, the elements that can be modified or replaced described below are described with reference to the following drawings, but the elements that can be modified or replaced are combined with each other, or combined with the elements described above so that a semiconductor device according to an example embodiment may be configured.

Figure 3:
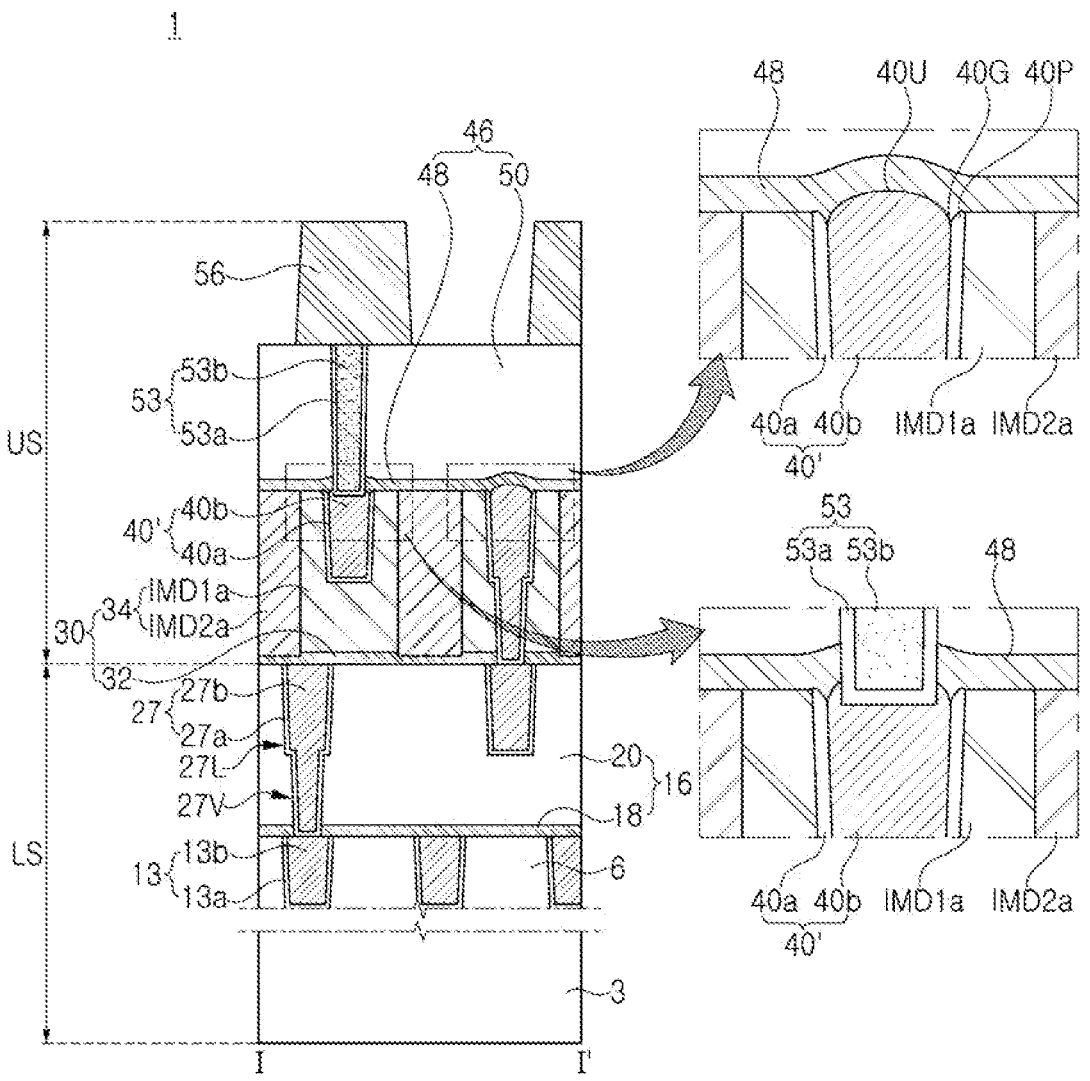
FIG. 3 is a cross-sectional view schematically illustrating a modified semiconductor device according to an example embodiment.

FIG. 3 is a cross-sectional view schematically illustrating a region taken along line I-I' of FIG. 1 in order to illustrate a modified example of the intermediate interconnection structure 40 described with reference to FIGS. 2A and 2B.

In the modified example, referring to FIG. 3, an intermediate interconnection structure 40' may include an intermediate interconnection material layer 40b having an upwardly convex upper surface 40U and an intermediate barrier material layer 40a including a protruding portion 40P extending upwardly from a side surface of the intermediate interconnection material layer 40b.

In the intermediate interconnection structure 40', a groove 40G between the upper surface 40U of the intermediate interconnection material layer 40b and the protruding portion 40P of the intermediate barrier material layer 40a may be filled by the upper etch-stop layer 48.

Figure 4:
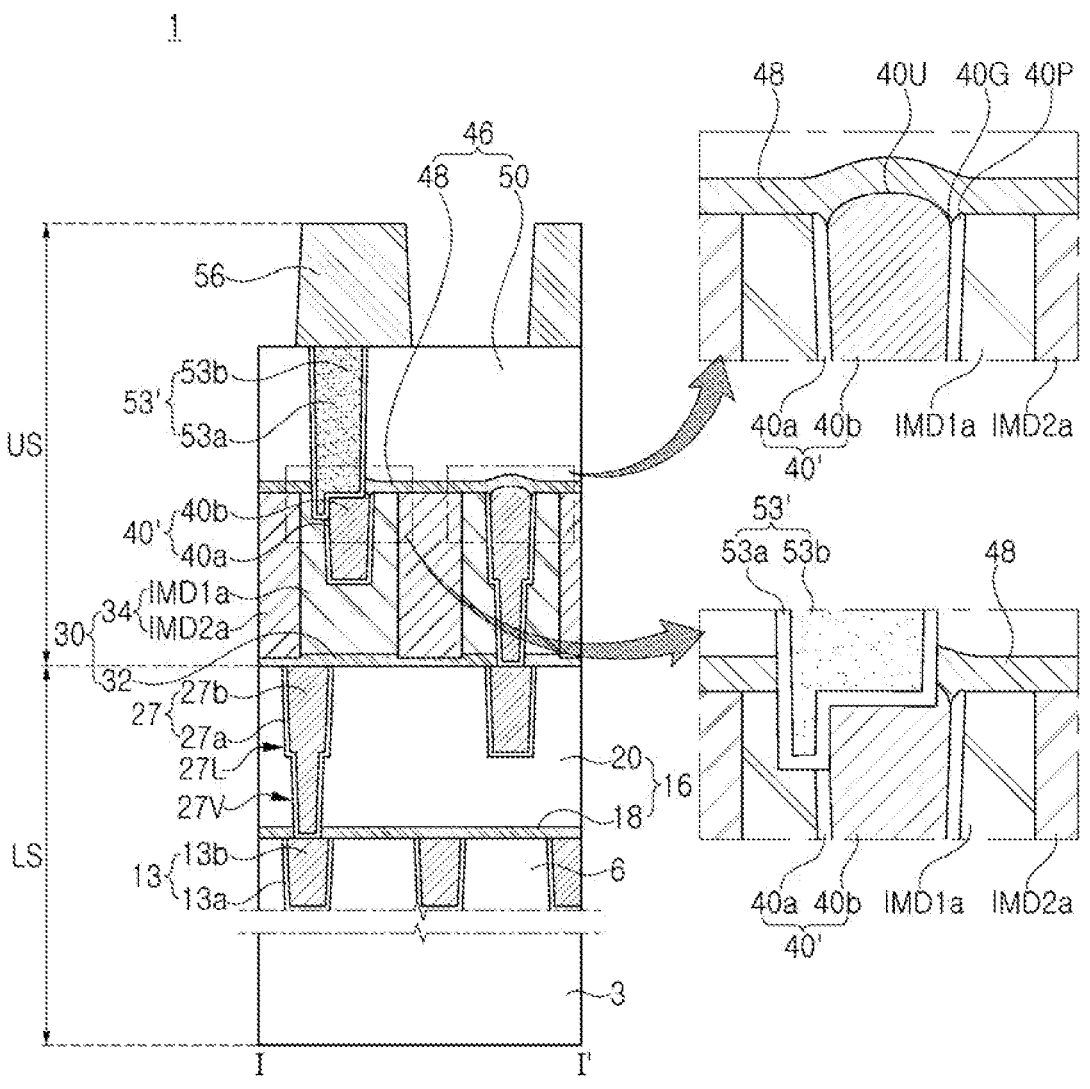
FIG. 4 is a cross-sectional view schematically illustrating a modified semiconductor device according to an example embodiment.

FIG. 4 is a cross-sectional view schematically illustrating a region taken along line I-I' of FIG. 1 in order to illustrate a modified example of the upper conductive pattern 53 described with reference to FIGS. 2A and 2B.

In the modified example, referring to FIG. 4, an upper conductive pattern 53' may cover an upper surface and a side surface of the intermediate interconnection structure 40 described with reference to FIGS. 2A and 2B or the intermediate interconnection structure 40' described with reference to FIG. 3 at the same time. The upper conductive pattern 53' may contact at least a portion of an upper surface of the intermediate interconnection structure 40' and a portion of a side surface of the intermediate interconnection structure 40'. Accordingly, by increasing a contact area between the upper conductive pattern 53' and the intermediate interconnection structure 40', contact resistance may be reduced.

Figure 5:
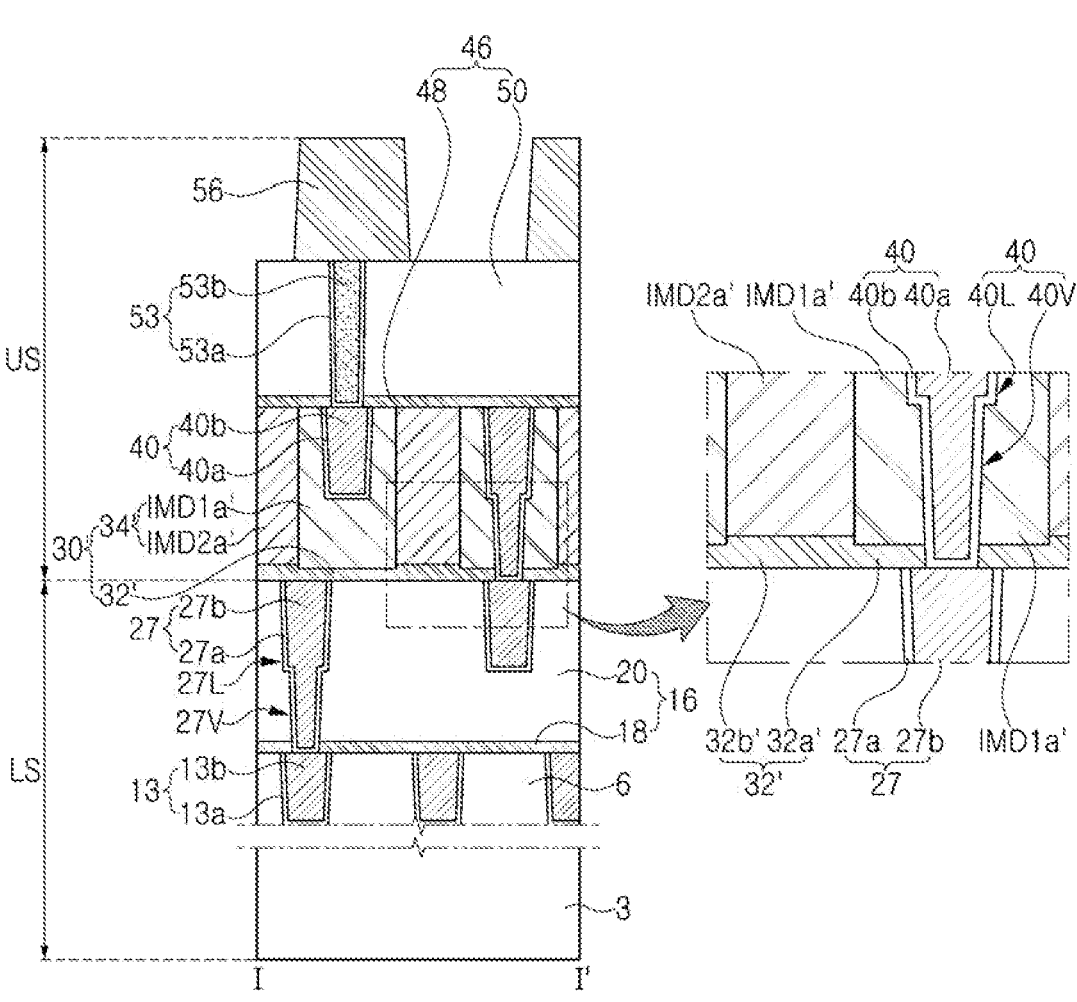
FIG. 5 is a cross-sectional view schematically illustrating a modified semiconductor device according to an example embodiment.

FIG. 5 is a cross-sectional view schematically illustrating a region taken along line I-I' of FIG. 1 in order to illustrate a modified example of the intermediate insulating structure 30 described in FIGS. 2A and 2B.

In the modified example, referring to FIG. 5, an intermediate insulating structure 30' may include an intermediate etch-stop layer 32'.

In an implementation, the intermediate etch-stop layer 32' may include a first portion 32a' and a second portion 32b' having a thickness smaller than the thickness of the first portion 32a'. A first intermediate material layer IMD1a' may be contact with the first portion 32a'. A second intermediate material layer IMD2a' may be contact with the second portion 32b'. In an implementation, the intermediate insulating structure 30' may include the intermediate etch-stop layer 32', the first intermediate material layer IMD1a', and the second intermediate material layer IMD2a'.

Figure 6:
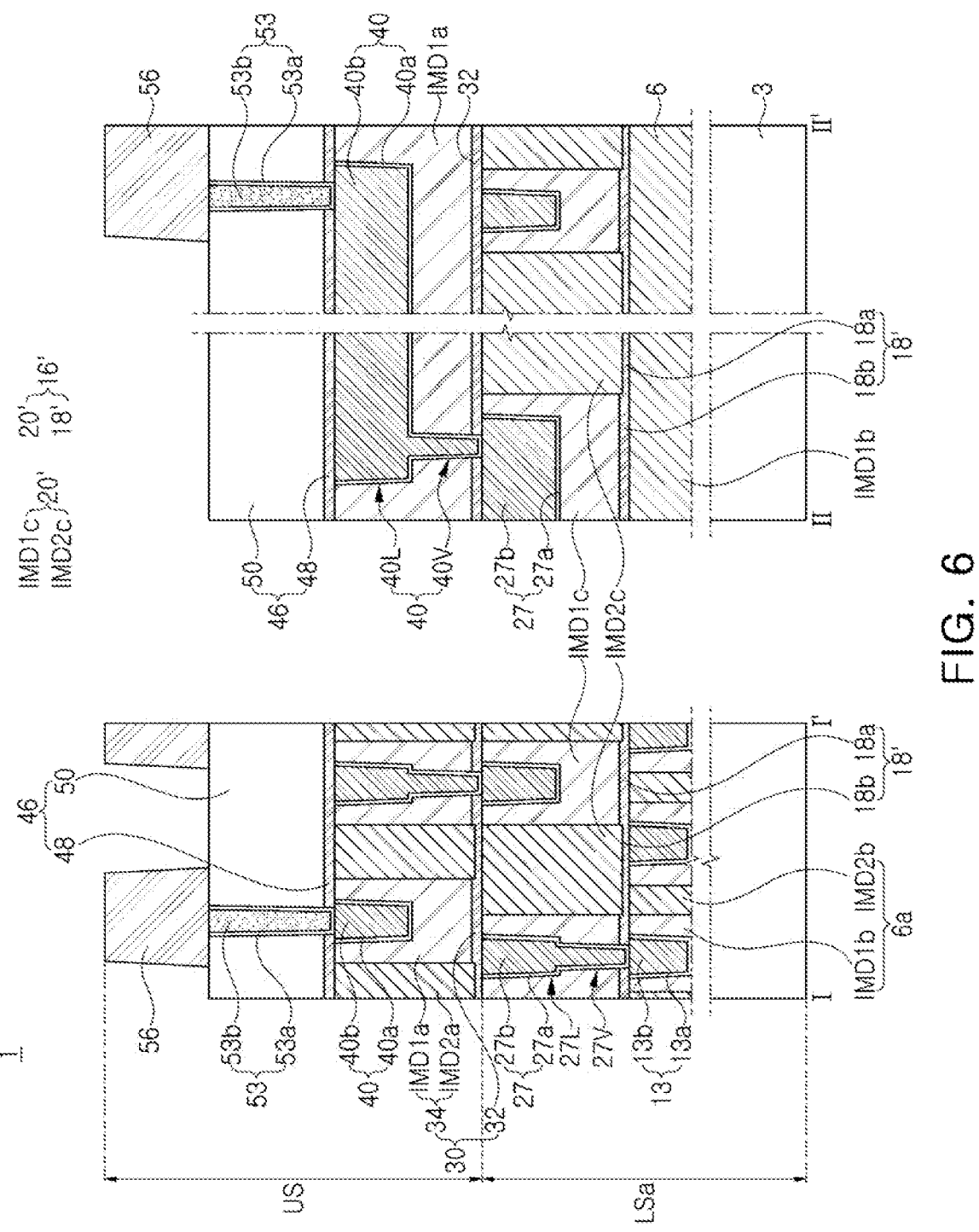
FIG. 6 is a cross-sectional view schematically illustrating a modified semiconductor device according to an example embodiment.

FIG. 6 is a cross-sectional view schematically illustrating regions taken along the lines I-I' and II-II' of FIG. 1 in order to illustrate a modified example of the first lower insulating layer 6 and the lower insulating structure 16 described in FIGS. 2A and 2B.

In the modified example, referring to FIG. 6, a first lower insulating layer 6a may include a first lower material layer IMD1b and a second lower material layer IMD2b.

A material of the first lower material layer IMD1b may have a dielectric constant that is higher than that of a material of the second lower material layer IMD2b.

The material of the first lower material layer IMD1b may include, e.g., silicon oxide, and the material of the second lower material layer IMD2b may include, e.g., a low dielectric material having a dielectric constant that is lower than that of silicon oxide.

The first lower material layer IMD1b may include, e.g., TetraEthylOrthoSilicate (TEOS) oxide, and the second lower material layer IMD2b may include, e.g., SiOCH or SiOC, having a lower dielectric constant than that of TEOS oxide.

The material of the first lower material layer IMD1b and the material of the second lower material layer IMD2b may be low dielectrics having a dielectric constant lower than 3.9. In an implementation, the material of the first lower material layer IMD1b may be a first low dielectric, and the material of the second lower material layer IMD2b may be a second low dielectric having a dielectric constant that is lower than that of the first low dielectric.

The first lower interconnection structure 13 may penetrate through the first lower material layer IMD1b, and may be spaced apart from the second lower material layer IMD2b.

A second lower insulating layer 20' may include a third lower material layer IMD1c and a fourth lower material layer IMD2c.

A material of the third lower material layer IMD1c may have a dielectric constant that is higher than that of a material of the fourth lower material layer IMD2c.

The material of the third lower material layer IMD1c may include, e.g., silicon oxide, and the material of the fourth lower material layer IMD2c may include, e.g., a low dielectric material having a dielectric constant that is lower than that of silicon oxide.

The third lower material layer IMD1c may include, e.g., TetraEthylOrthoSilicate (TEOS) oxide, and the fourth lower material layer IMD2c may include, e.g., SiOCH or SiOC, having a dielectric constant, lower than that of TEOS oxide.

The material of the third lower material layer IMD1c and the material of the fourth lower material layer IMD2c may be low dielectrics having a dielectric constant lower than 3.9. In an implementation, the material of the third lower material layer IMD1c may be a first low dielectric, and the material of the fourth lower material layer IMD2c may be a second low dielectric having a dielectric constant that is lower than that of the first low dielectric.

A lower etch-stop layer 18' may include a first portion 18a (vertically overlapping the first lower material layer IMD1b and in contact therewith) and a second portion 18b (vertically overlapping the second lower material layer IMD2b and in contact therewith). The first portion 18a may have a thickness greater than that of the second portion 18b. The second lower interconnection structure 27 may penetrate through the third lower material layer IMD1c and the first portion 18a.

The lower insulating structure 16' may include the lower etch-stop layer 18' and the second lower insulating layer 20'.

Figure 7:
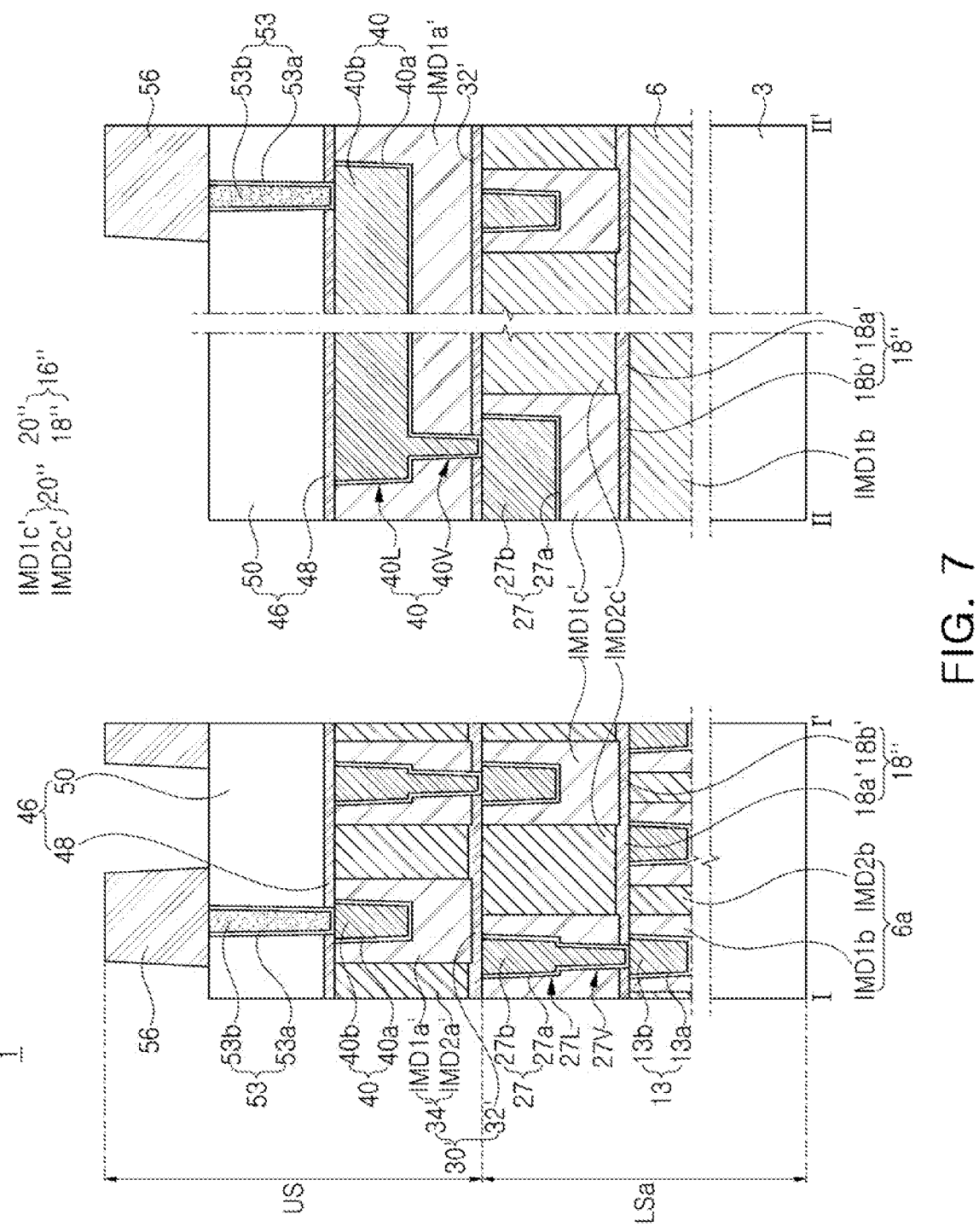
FIG. 7 is a cross-sectional view schematically illustrating a modified semiconductor device according to an example embodiment.

FIG. 7 is a cross-sectional view schematically illustrating regions taken along lines I-I' and II-II' of FIG. 1 in order to illustrate a modified example of the lower insulating structure 16 described in FIG. 6.

In the modified example, referring to FIG. 7, a lower etch-stop layer 18" may include a first portion 18a' and a second portion 18b', the second portion 18b' having a thickness smaller than a thickness of the first portion 18a'. A fourth lower material layer IMD2c' may be in contact with the first portion 18a'. A third lower material layer IMD1c' may be in contact with the second portion 18b'. In an implementation, the lower insulating structure 16" may include the lower etch-stop layer 18", the third lower material layer IMD1c', and the fourth lower material layer IMD2c'.

Figure 8:
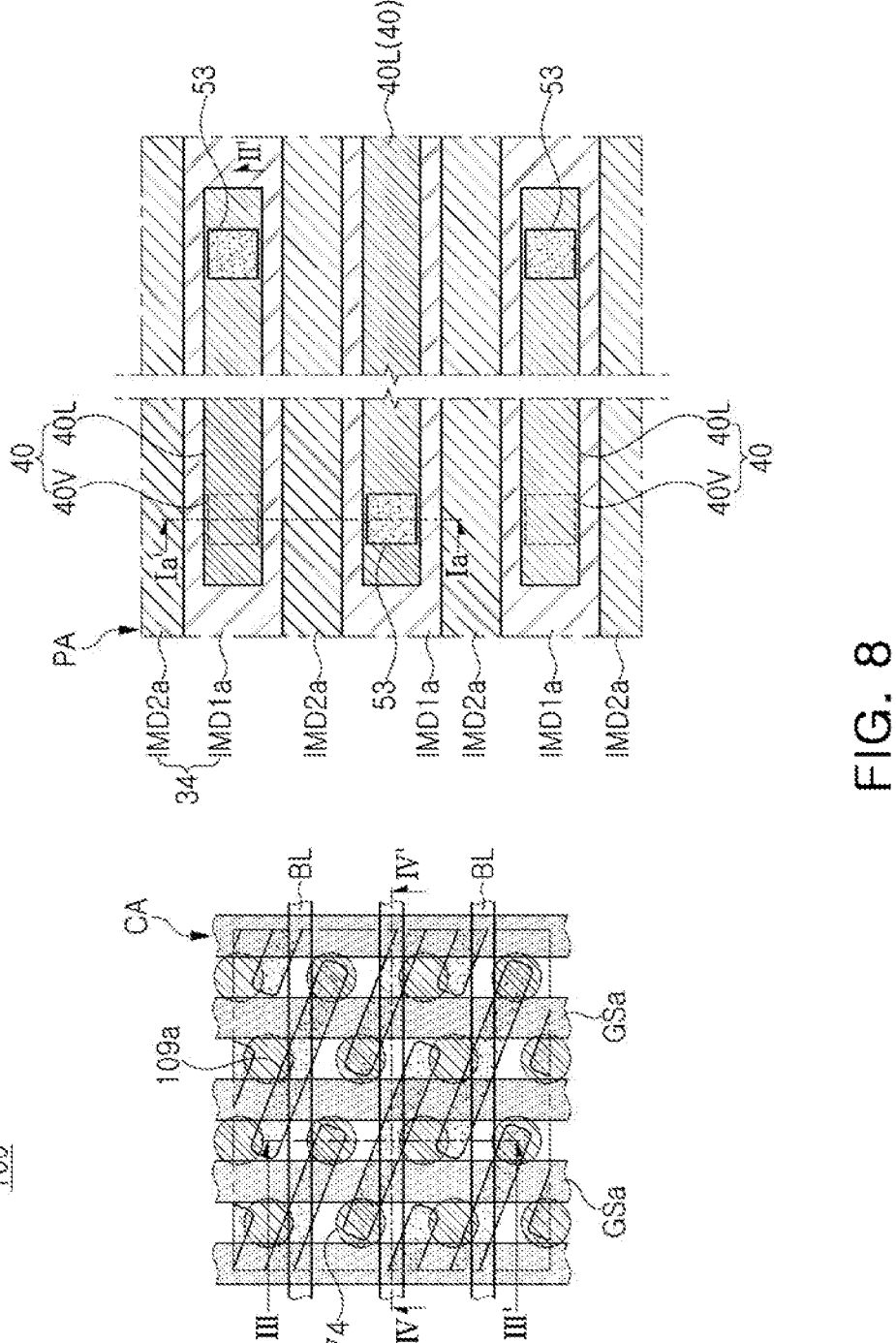
FIGS. 8 to 10 are diagrams schematically illustrating modified semiconductor devices according to an example embodiment.

Next, an exemplary embodiment of a semiconductor device including any one of the example embodiments described with reference to FIGS. 1 to 7 will be described with reference to FIGS. 8, 9 and 10. FIG. 8 is a top view schematically illustrating a semiconductor device according to an example embodiment, and FIG. 9 is a cross-sectional view schematically illustrating regions taken along lines and IV-IV' of FIG. 8, and FIG. 10 is a cross-sectional view schematically illustrating regions taken along line Ia-Ia' of FIG. 8.

Figure 9:
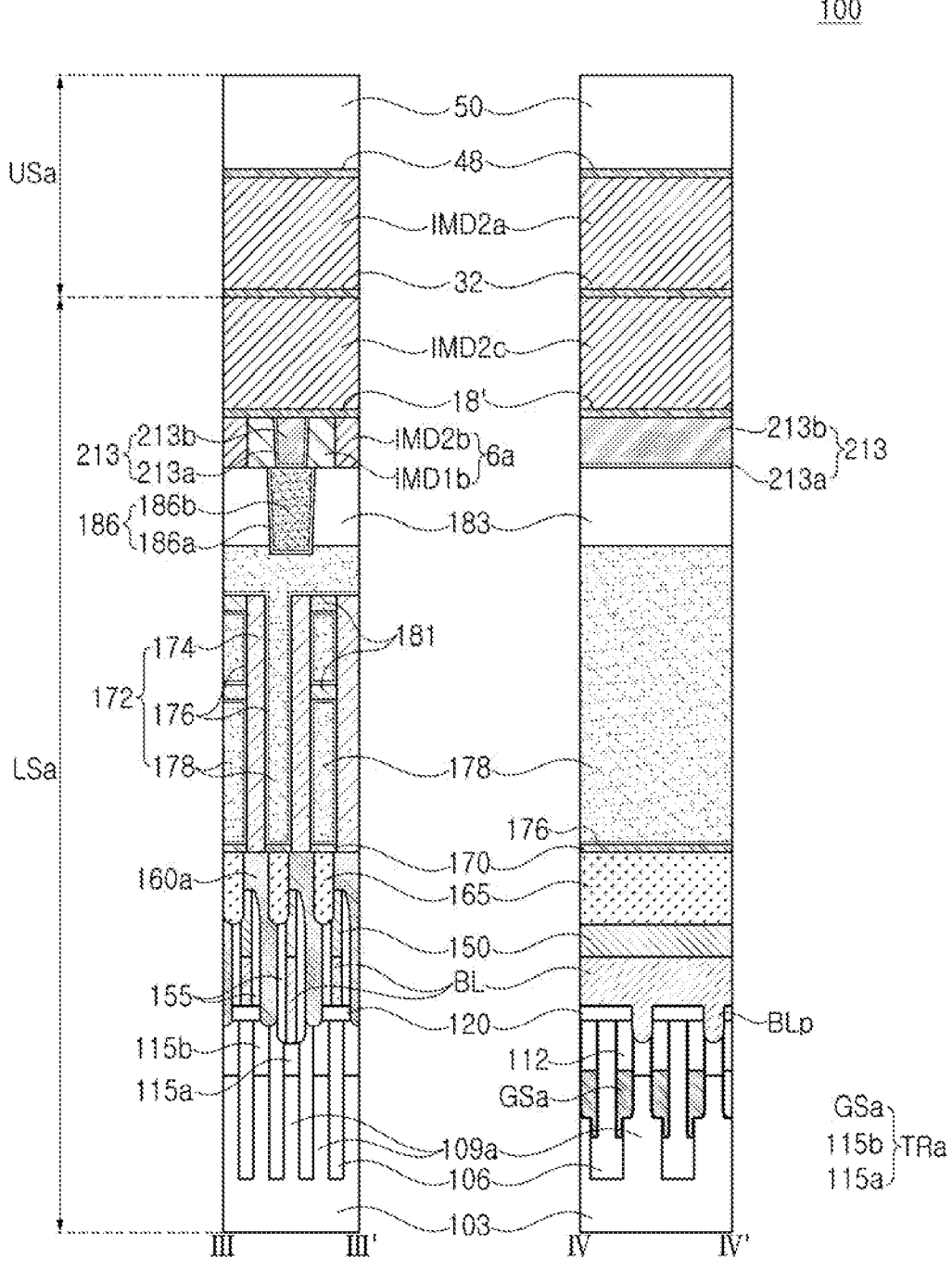
Figure 10:
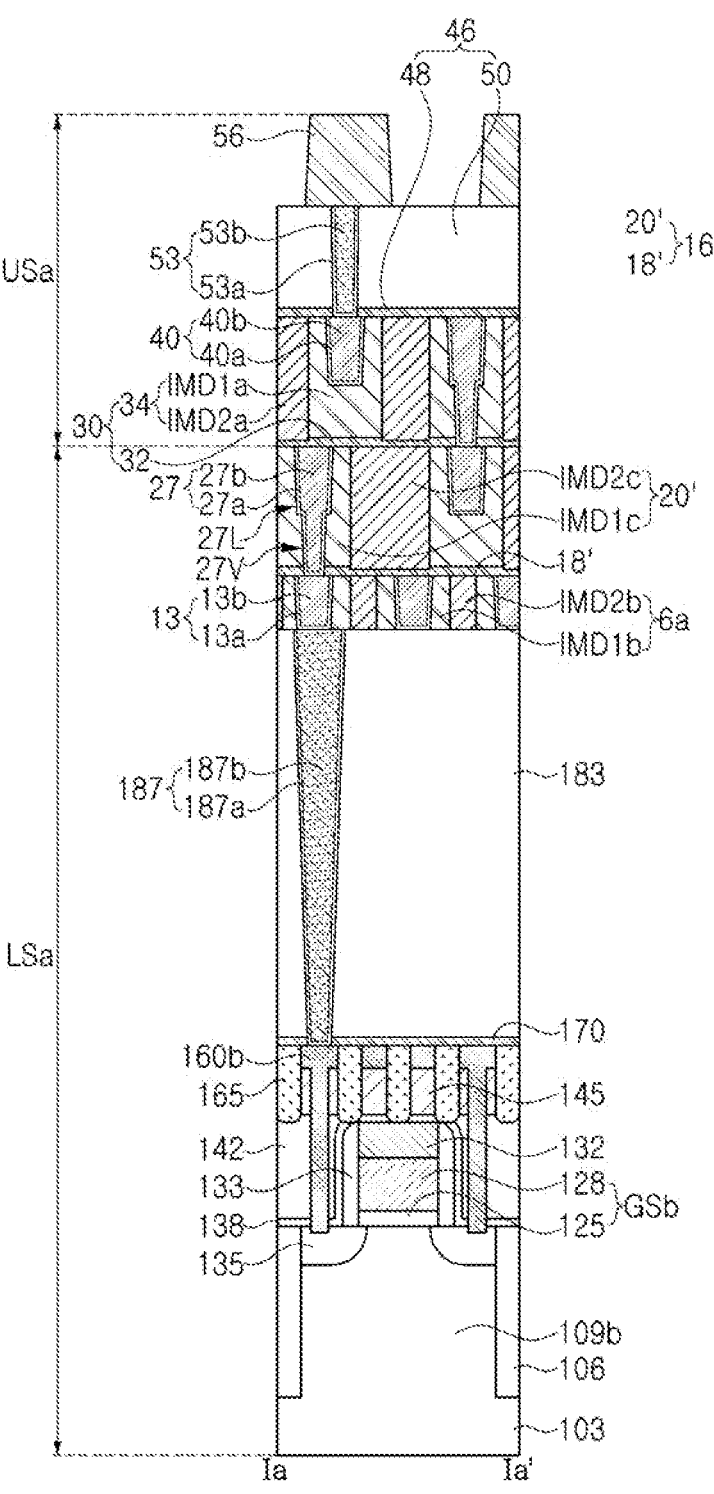

Referring to FIGS. 8, 9, and 10, a semiconductor device 100 according to an example embodiment may include a memory cell region CA and a peripheral region PA. The semiconductor device 100 may include a lower structure LSa and an upper structure USa on the lower structure LSa. In the peripheral region PA, the upper structure USa may be the same as any one of the example embodiments described with reference to FIGS. 1 to 7.

The lower structure LSa may include a substrate 103, and a device isolation layer 106 defining a cell active region 109a in the memory cell region CA and a peripheral active region 109b in the peripheral region PA. The substrate 103 may be a semiconductor substrate. The cell active region 109a and the peripheral active region 109b may have a shape protruding from the substrate 103 in the vertical direction. The device isolation layer 106 may be formed by shallow trench isolation. The device isolation layer 106 may be formed of an insulating material, e.g., silicon oxide or silicon nitride.

The lower structure LSa may include cell gate structures GSa buried in the cell active region 109a in the memory cell region CA and extending into the device isolation layer 106 and cell gate capping patterns 112 on the cell gate structures GSa. The cell gate structures GSa and the cell gate capping patterns 112 may be in cell gate trenches crossing the cell active region 109a and extending into the device isolation layer 106.

Each of the cell gate structures GSa may include a cell gate dielectric layer and a cell gate electrode. The cell gate electrode may be a word line of a memory semiconductor device such as DRAM. The cell gate structures GSa may include word lines.

The lower structure LSa may further include a first source/drain region 115a and a second source/drain region 115b in the cell active region 109a. The cell gate structure GSa and the cell sources/drains 115a/115b may constitute cell transistors TRa.

The lower structure LSa may include, in the memory cell region CA, a buffer insulating layer 120 on the cell active region 109a and the device isolation layer 106, a bit line BL on the buffer insulating layer 120 and including a plug portion BLP penetrating through the buffer insulating layer 120, a bitline capping layer 150 on the bit line BL, cell contact structures 160a on both sides of the bit line BL and including a pad portion extending onto the bitline capping layer 150, an insulating separation structure 165 between the pad portions of the cell contact structures 160a and extending downwardly, and insulating spacers 155 on side surfaces of the bit line BL and the bitline capping layer 150.

The lower structure LSa may further include peripheral transistors in the peripheral area PA. The peripheral transistors may include a peripheral gate structure GSb on the peripheral active region 109b and peripheral source/drain regions 135 in the peripheral active region 109b on both sides of the peripheral gate structure GSb. The peripheral gate structure GSb may include a peripheral gate dielectric layer 125 and a peripheral gate electrode 128 on the peripheral gate dielectric layer 125.

The lower structure LSa may include a peripheral gate capping layer 132 on the peripheral gate structure GSb, a gate spacer 133 on a side surface of the peripheral gate structure GSb, an insulating liner 138 covering the peripheral transistor, the gate spacer 133, and the peripheral gate capping layer 132, and a peripheral interlayer insulating layer 142 on the insulating liner 138.

The lower structure LSa may further include a peripheral capping layer 145 on the peripheral interlayer insulating layer 142, and a peripheral contact structure 160b penetrating through the peripheral capping layer 145 and the peripheral interlayer insulating layer 142 and electrically connected to the peripheral transistor, the peripheral contact structure 160b including a pad portion located on a higher level than the peripheral capping layer 145. The insulating separation structure 165 may extend downwardly while defining a side surface of the pad portion of the peripheral contact structure 160b.

The lower structure LSa may further include an insulating etch-stop layer 170 covering the cell contact structures 160a, the peripheral contact structure 160b, and the insulating separation structure 165.

The lower structure LSa may include a data storage structure 172 for storing information in the memory cell region CA. The data storage structure 172 may include a cell capacitor storing information in a DRAM, e.g., lower electrodes 174, a dielectric layer 176 covering the lower electrodes 174, and an upper electrode 178 covering the dielectric layer 176.

The lower structure LSa may further include an interlayer insulating layer 183 covering the data storage structure 172 in the memory cell region CA and covering the etch-stop layer 170 in the peripheral region PA.

The lower structure LSa may further include a first contact plug 186 penetrating through the interlayer insulating layer 183 in the memory cell region CA and electrically connected to the upper electrode 178 and a second contact plug 187 penetrating through the interlayer insulating layer 183 and the etch-stop layer 170 in the peripheral region PA and electrically connected to a pad portion of the peripheral contact structure 160*b*.

The first contact plug 186 may include a plug material layer 186*b* and a barrier layer 186*a* covering a side surface and a bottom surface of the plug material layer 186*b*. The second contact plug 187 may include a plug material layer 187*b* and a barrier layer 187*a* covering a side surface and a bottom surface of the plug material layer 187*b*.

The lower structure LSa may further include a first lower insulating layer 6*a* on the interlayer insulating layer 183.

In an implementation, the first lower insulating layer 6*a* may include the first lower material layer IMD1*b* and the second lower material layer IMD2*b* as illustrated in FIG. 6. In an implementation, the first lower insulating layer 6*a* may be the first lower insulating layer 6 as illustrated in FIGS. 2A and 2B.

The first lower insulating layer 6*a* may be referred to as a first lower insulating structure. The first lower insulating layer 6*a* may be on a higher level than the cell gate structure GSa, which may be word lines, the peripheral gate structure GSb, the bit line BL, and the data storage structure 172.

The lower structure LSa may further include a cell interconnection structure 213 penetrating through the first lower material layer IMD1*b* and in contact with the first contact plug 186 in the memory cell region CA. The cell interconnection structure 213 may include an interconnection material layer 213*b* and a barrier layer 213*a* covering a side surface and a bottom surface of the interconnection material layer 213*b*.

The lower structure LSa may further include a first lower interconnection structure 13 penetrating through the first lower material layer IMD1*b* in the peripheral region PA and in contact with the second contact plug 187. The first lower interconnection structure 13 may include an interconnection material layer 13*b* and a barrier material layer 13*a* covering a side surface and a bottom surface of the interconnection material layer 13*b*. The cell interconnection structure 213 and the first lower interconnection structure 13 may be formed of the same material.

The lower structure LSa may further include the lower insulating structure 16' and the second lower interconnection structure 27 as illustrated in FIG. 6. In an implementation, the lower insulating structure 16' may be replaced.

As described above, in the peripheral region PA, the upper structure USa may be the same as the upper structure US of any one of the example embodiments described with reference to FIGS. 1 to 7. In the memory cell region CA, the upper structure USa may include at least a portion of material layers in the peripheral region PA. In the memory cell region CA, the upper structure USa may include material layers in the peripheral region PA, e.g., the lower etch-stop layer 18', the third lower material layer IMD2*c*, the intermediate etch-stop layer 32, the second intermediate material layer IMD2*a*, the upper etch-stop layer 48, and the upper insulating layer 50, which are sequentially stacked.

Next, an exemplary method of forming a semiconductor device according to an example embodiment will be described with reference to FIGS. 1 and 11A to 11F. FIGS.

11A to 11F are cross-sectional views schematically illustrating regions taken along lines I-I' and II-II' of FIG. 1.

Figure 11A:
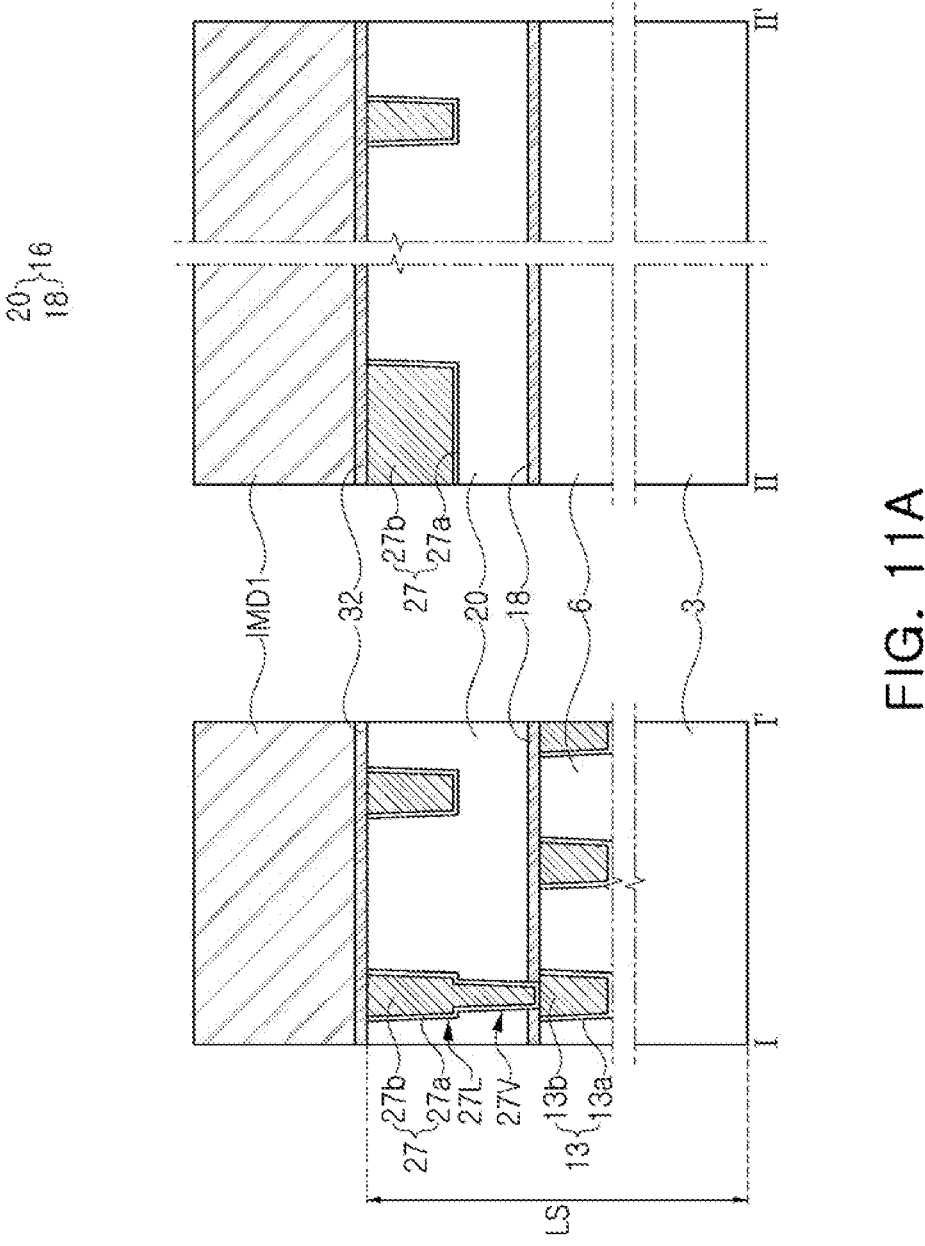
FIGS. 11A to 11F are cross-sectional views of stages in a method of forming a semiconductor device according to an example embodiment.

Referring to FIGS. 1 and 11A, a lower structure LS may be formed. Forming the lower structure LS may include forming a first lower insulating layer 6 on the base 3, forming a first lower interconnection structure 13 penetrating through the first lower insulating layer 6, forming a lower insulating structure 16 covering the first lower insulating layer 6 and the first lower interconnection structure 13, and forming a second lower interconnection structure 27 in the lower insulating structure 16.

The first lower interconnection structure 13 may include an interconnection material layer 13*b* and a barrier material layer 13*a* covering a side surface and a bottom surface of the interconnection material layer 13*b*. The lower insulating structure 16 may include a lower etch-stop layer 18 and a second lower insulating layer 20 on the lower etch-stop layer 18. The second lower interconnection structure 27 may include an interconnection material layer 27*b* and a barrier material layer 27*a* covering a side surface and a bottom surface of the interconnection material layer 27*b*.

An intermediate etch-stop layer 32 and a first intermediate material layer IMD1 may be sequentially formed on the lower structure LS.

In an implementation, the intermediate etch-stop layer 32 may be formed of an insulating material including, e.g., SiN, SiBN, or SiCN. In an implementation, the intermediate etch-stop layer 32 may be formed of an insulating material that is different from that of silicon oxide.

Figure 11B:
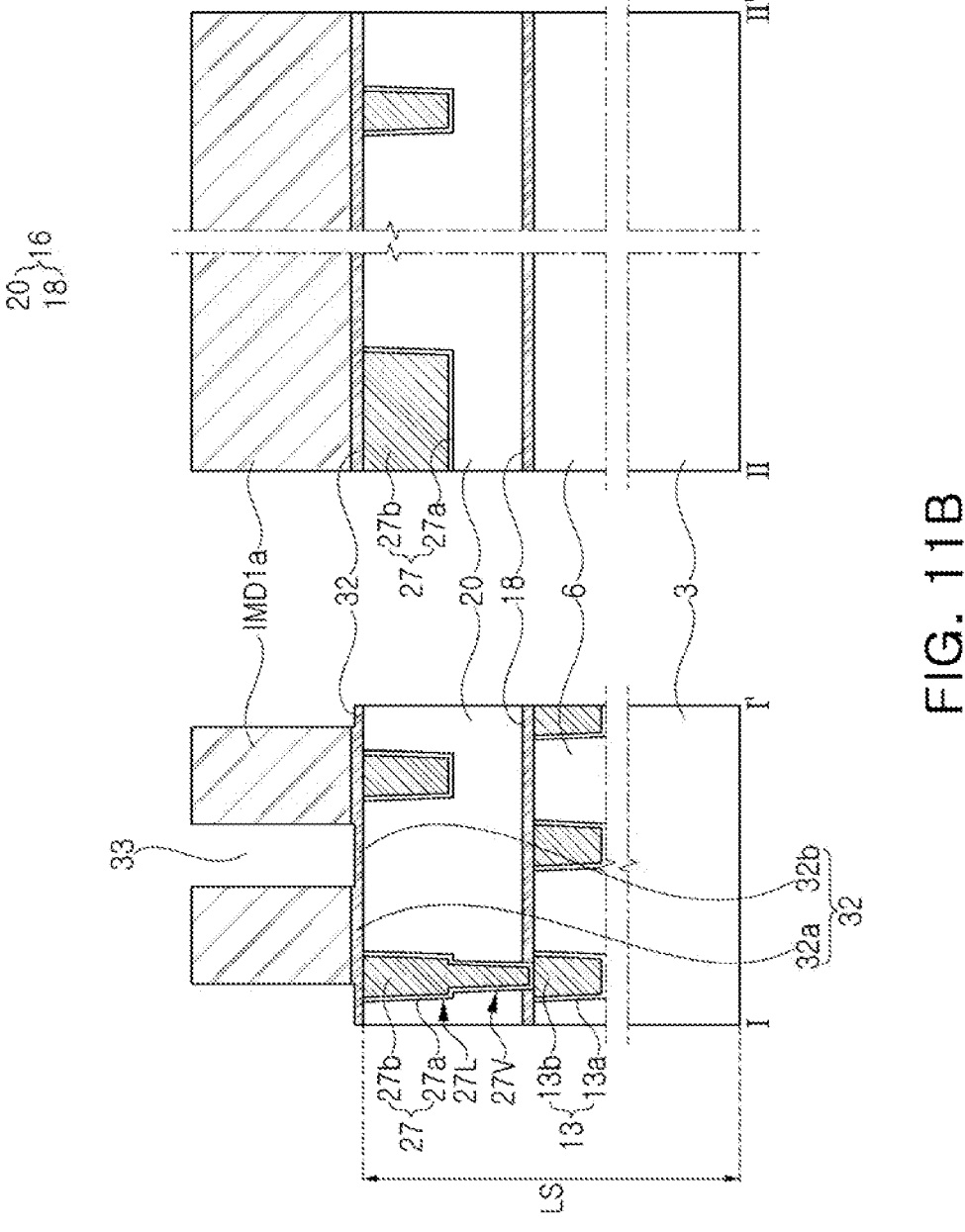

Referring to FIGS. 1 and 11B, a first intermediate material layer IMD1*a* having an opening 33 may be formed by patterning the first intermediate material layer IMD1.

While the first intermediate material layer IMD1 is patterned, a thickness of the intermediate etch-stop layer 32 exposed by the opening 33 may be reduced. Therefore, the intermediate etch-stop layer 32 may include a first portion 32*a*, vertically overlapping the patterned first intermediate material layer IMD1*a* and in contact therewith, and a second portion 32*b* exposed by the opening 33 and having a reduced thickness.

Figure 11C:
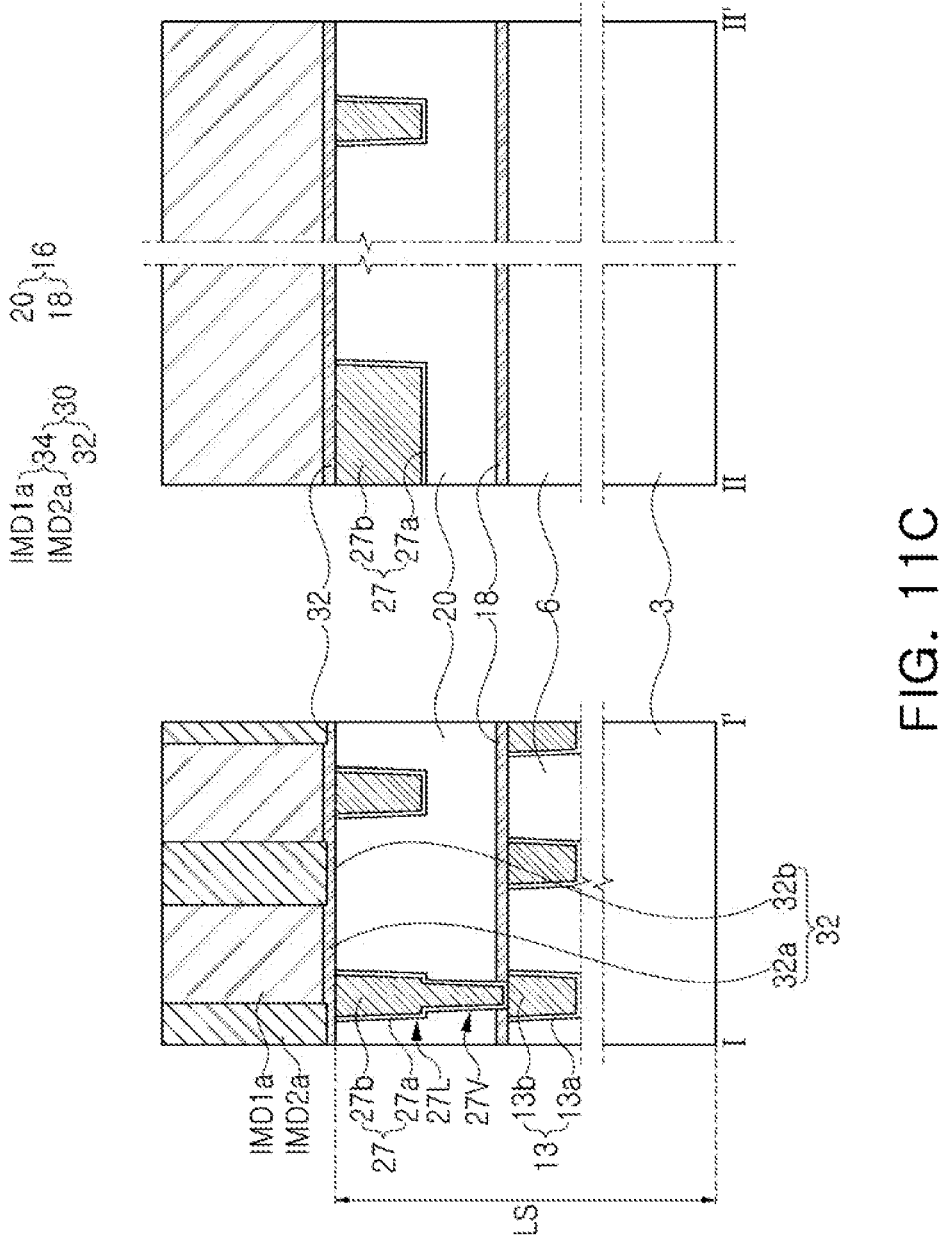

Referring to FIGS. 1 and 11C, a second intermediate material layer IMD2*a* filling the opening 33 may be formed. Forming the second intermediate material layer IMD2*a* may include forming an insulating layer filling the opening 33 and covering the first intermediate material layer IMD1*a*, and planarizing the insulating layer until an upper surface of the first intermediate material layer IMD1*a* is exposed. The planarization may be performed using a chemical and mechanical polishing process.

The first intermediate material layer IMD1*a* may be formed of a material having a dielectric constant that is higher than that of the second intermediate material layer IMD2*a*.

In an implementation, the first intermediate material layer IMD1*a* may be formed of, e.g., silicon oxide, and the second intermediate material layer IMD2*a* may be formed of, e.g., a low dielectric having a dielectric constant lower than that of silicon oxide.

In an implementation, the first intermediate material layer IMD1*a* may be formed of, e.g., TetraEthylOrthoSilicate (TEOS) oxide, and the second intermediate material layer IMD2*a* may be formed of, e.g., SiOCH or SiOC, having a lower dielectric constant than TEOS oxide.

A material of the first intermediate material layer IMD1*a* and a material of the second intermediate material layer IMD2*a* may be low dielectrics having a dielectric constant lower than 3.9. In an implementation, the first intermediate material layer IMD1a may be formed of a first low dielectric, and the second intermediate material layer IMD2a may be formed of a second low dielectric having a lower dielectric constant lower than that of the first low dielectric.

The first intermediate material layer IMD1a and the second intermediate material layer IMD2a may constitute an intermediate insulating layer 34. The intermediate insulating layer 34 and the intermediate etch-stop layer 32 may constitute an intermediate insulating structure 30.

Figure 11D:
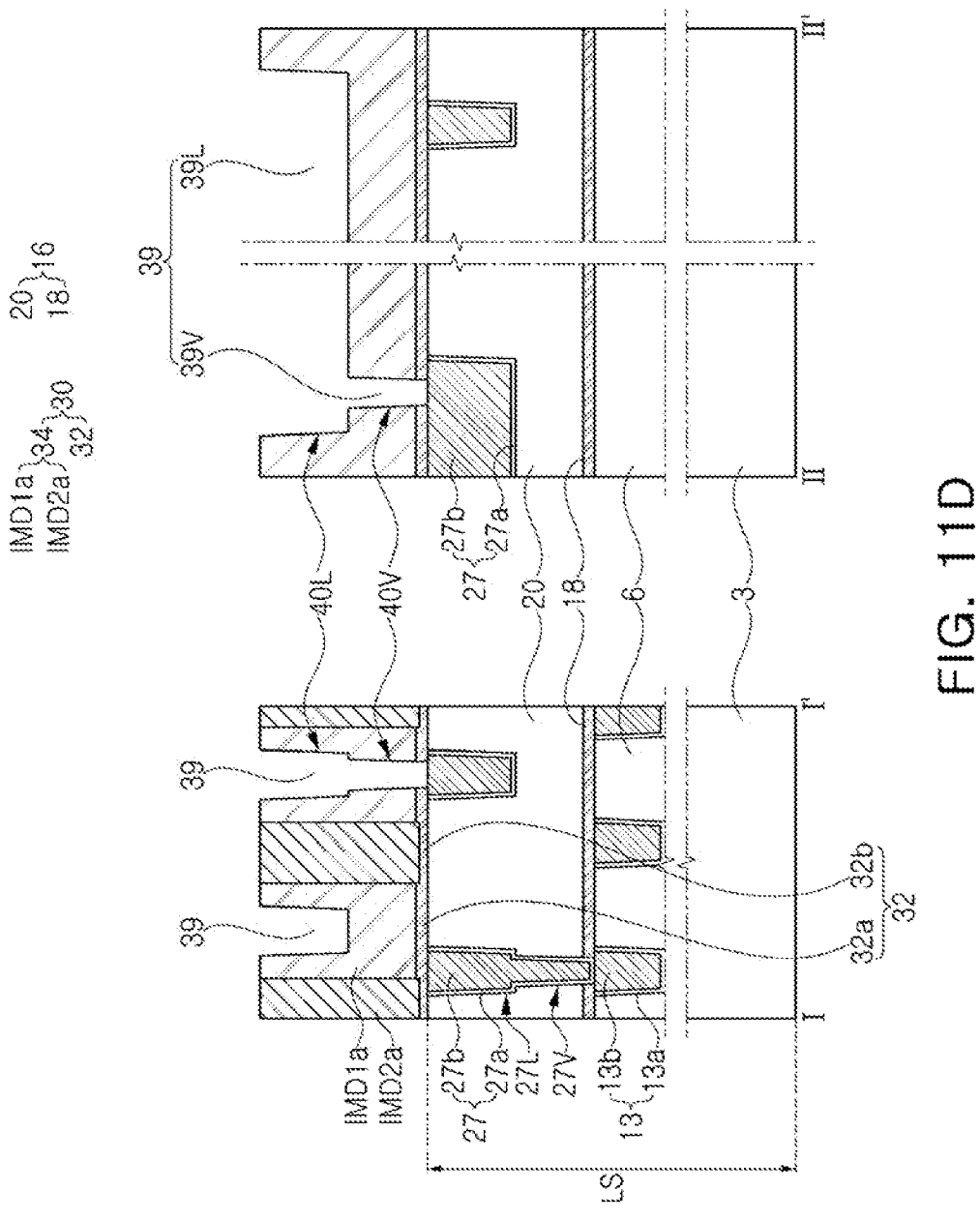

Referring to FIGS. 1 and 11D, an interconnection trench 39L in the first intermediate material layer IMD1a and an opening 39 including a via-hole 39V penetrating through the first intermediate material layer IMD1a below the interconnection trench 39L and the first portion 32a of the intermediate etch-stop layer 32 may be formed.

The first intermediate material layer IMD1a may be formed of a material having a dielectric constant higher than that of the second intermediate material layer IMD2a and having hardness, and the second intermediate material layer IMD2a may be formed of a material being relatively porous.

Figure 11E:
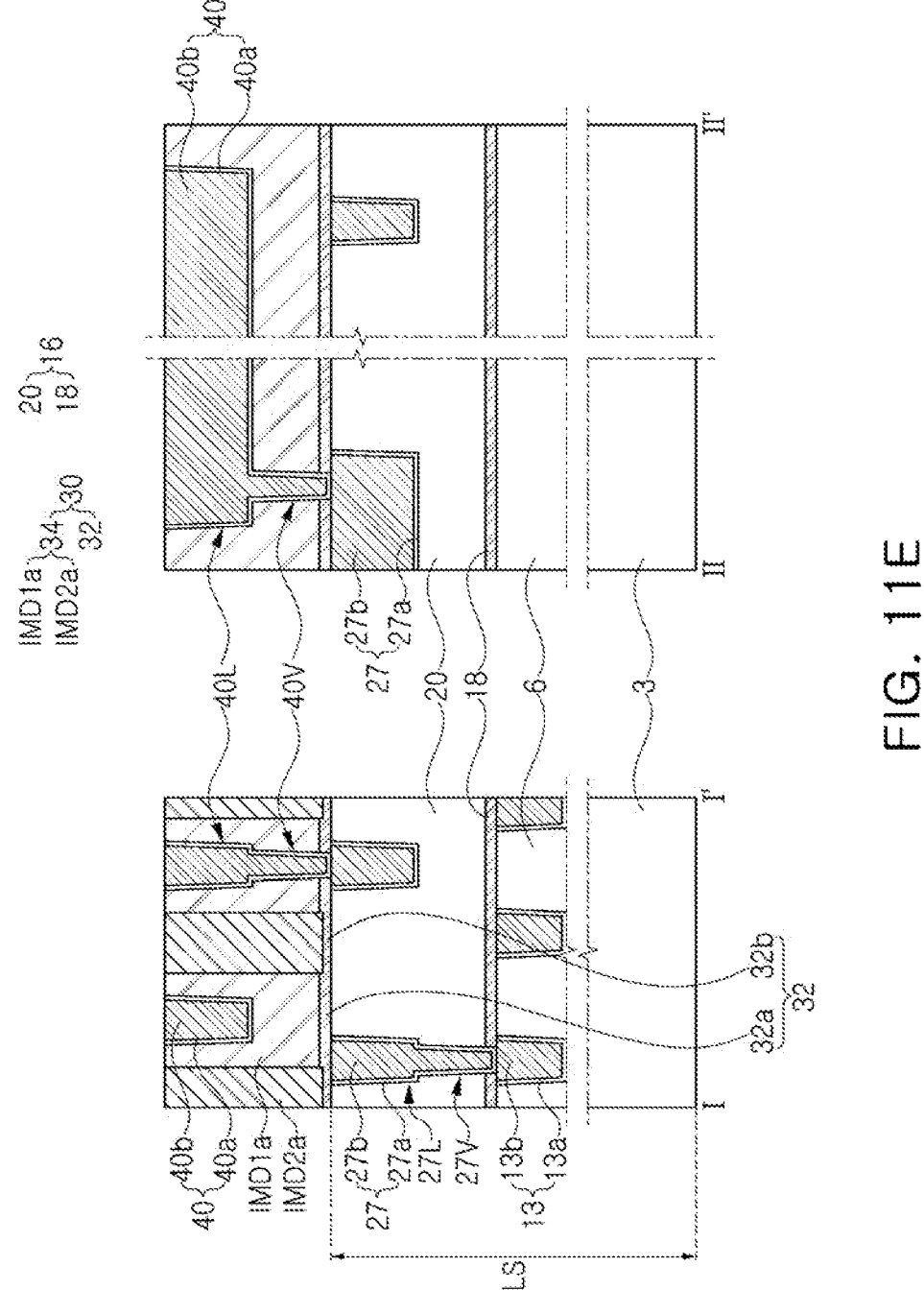

Referring to FIGS. 1 and 11E, an intermediate interconnection structure 40 may be formed in the opening 39. Forming the intermediate interconnection structure 40 may include forming an intermediate barrier material layer 40a, forming an intermediate interconnection material layer 40b on the intermediate barrier material layer 40a, and exposing an upper surface of the intermediate insulating structure 30 by performing a planarization process.

The intermediate interconnection structure 40 may include an intermediate via portion 40V in the via-hole 39V and an intermediate interconnection portion 40L in the interconnection trench 39L.

In an implementation, the intermediate interconnection structure 40 may be formed in the first intermediate material layer IMD1a that includes a material that is relatively hard, in a form of a dual damascene pattern, and may be spaced apart from the second intermediate material layer IMD2a that includes a material that is relatively porous. Therefore, the intermediate interconnection structure 40 may be stably and reliably formed.

Figure 11F:
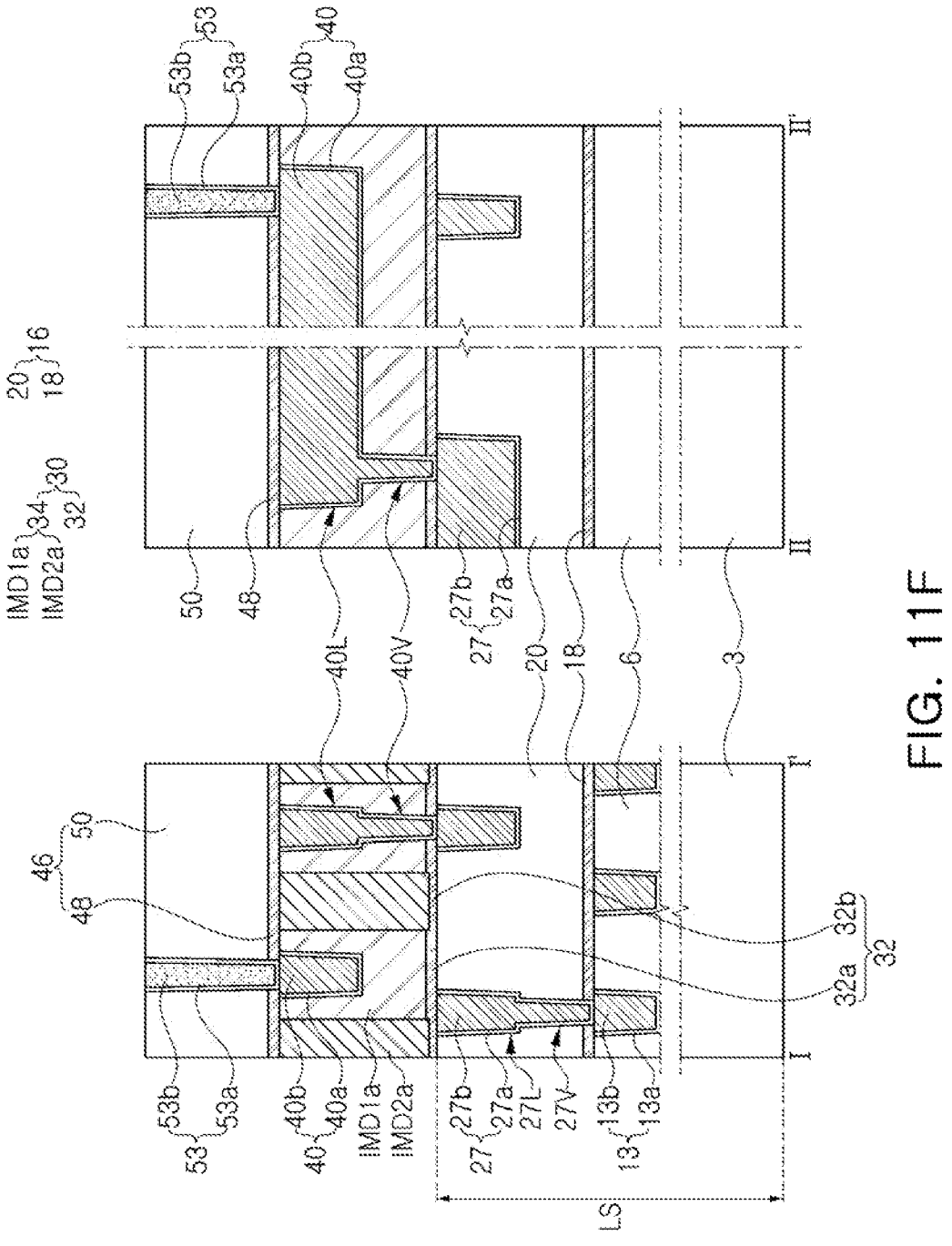

Referring to FIGS. 1 and 11F, an upper insulating structure 46 may be formed on the intermediate insulating structure 30 and the intermediate interconnection structure 40. The upper insulating structure 46 may include an upper etch-stop layer 48 and an upper insulating layer 50 sequentially stacked.

The upper insulating layer 50 may be formed a material having a higher dielectric constant than that of a material of the second intermediate material layer IMD2a. The upper insulating layer 50 may be formed of the same material as that of the first intermediate material layer IMD1a.

An upper conductive pattern 53 penetrating through the upper insulating structure 46 and electrically connected to the intermediate interconnection structure 40 may be formed. The upper conductive pattern 53 may include a plug pattern 53b and a barrier layer 53a covering a side surface and a bottom surface of the plug pattern 53b.

Referring to FIGS. 1, 2A and 2B, a conductive material layer may be formed on the upper insulating structure 46, and the conductive material layer may be patterned, so that an upper interconnection 56 electrically connected to the upper conductive pattern 53 may be formed.

Figure 12A:
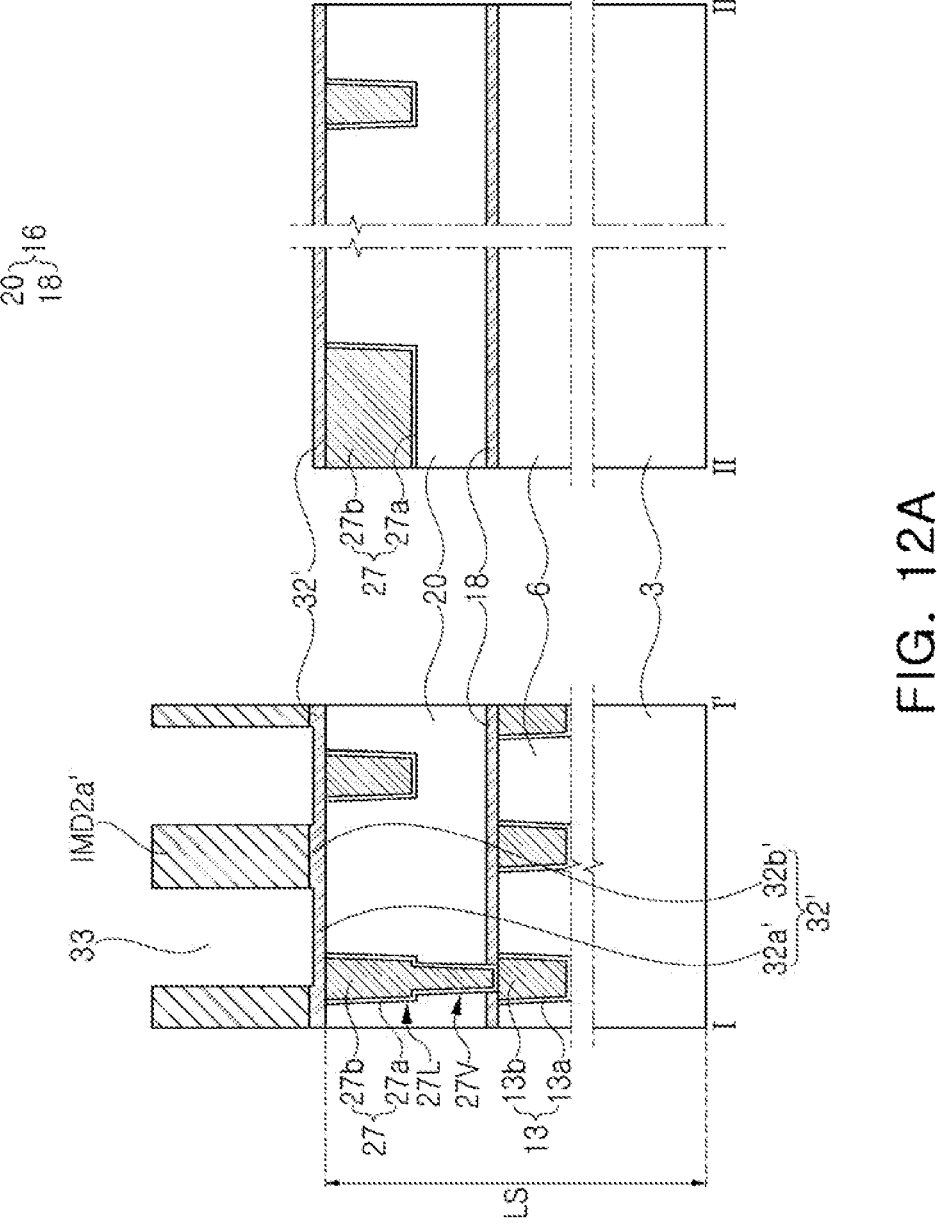
FIGS. 12A to 12C are cross-sectional views of stages in a method of forming a semiconductor device according to an example embodiment.
Figure 12B:
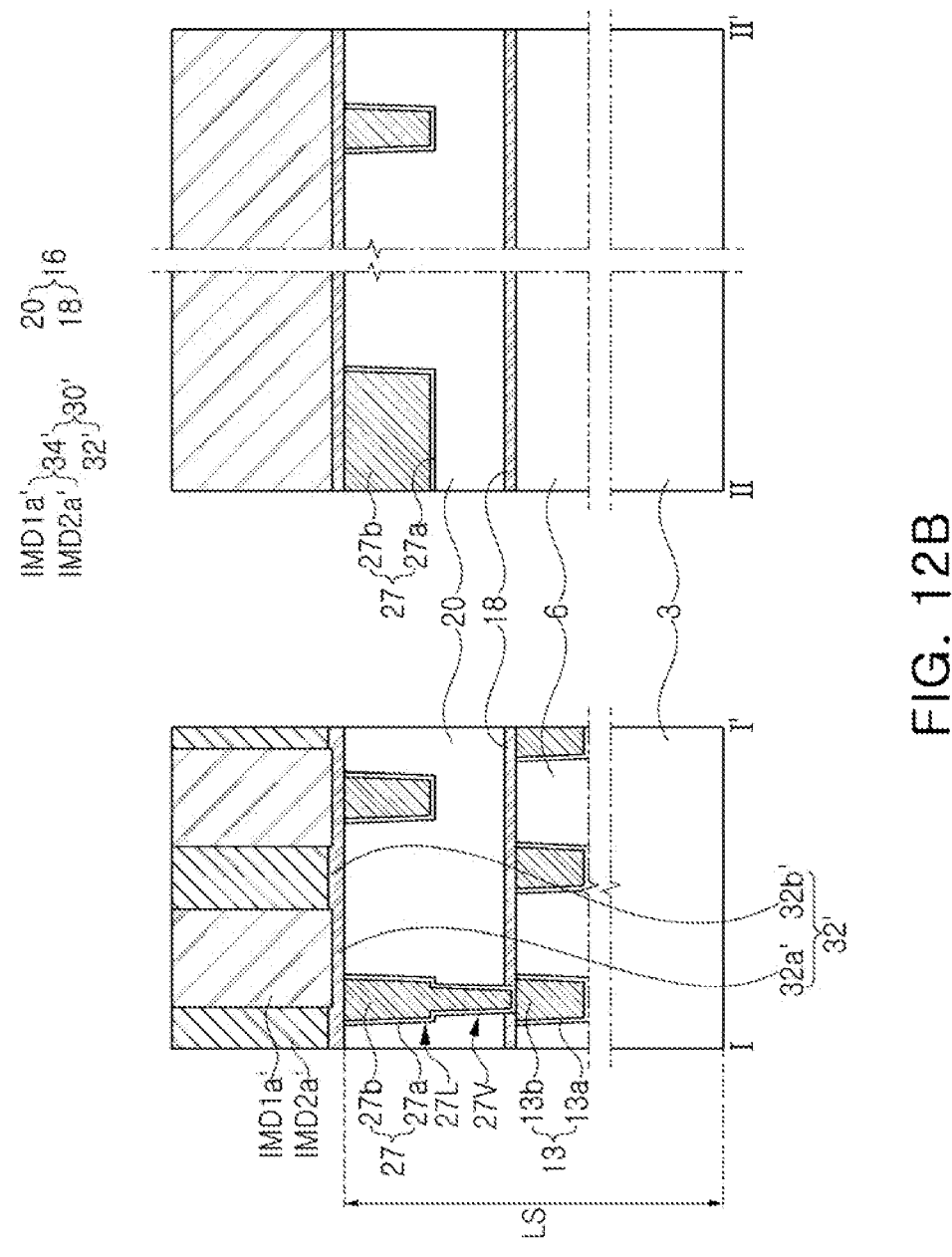
Figure 12C:
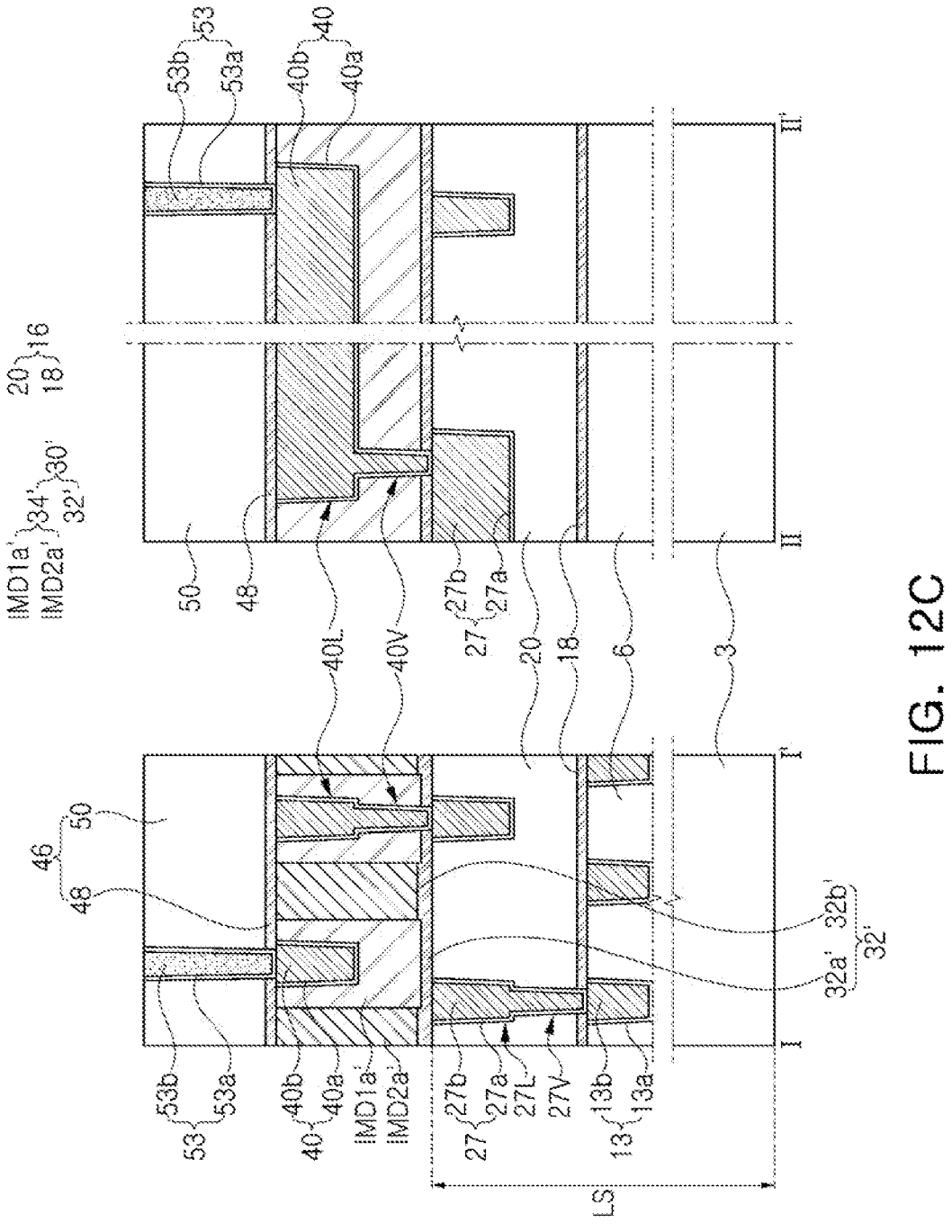

Next, another example of a method of forming a semiconductor device according to an example embodiment will be described with reference to FIGS. 12A to 12C. FIGS. 12A to 12C are cross-sectional views schematically illustrating regions taken along lines I-I' and II-II' of FIG. 1.

Referring to FIGS. 1 and 12A, an intermediate etch-stop layer 32' may be formed on the lower structure LS, and a second intermediate material layer IMD2a' may be formed on the intermediate etch-stop layer 32', and the second intermediate material layer IMD2a' may be patterned, so that an opening 33' exposing the intermediate etch-stop layer 32' may be formed.

The second intermediate etch-stop layer 32' may include a first portion 32a' exposed by the opening 33' and a second portion 32b' vertically overlapping the second intermediate material layer IMD2a', and in contact with the second intermediate material layer IMD2a'. A thickness of the first portion 32a' may be smaller than a thickness of the second portion 32b'.

Referring to FIGS. 1 and 12B, a first intermediate material layer IMD1a' filling the opening 33' may be formed. Forming the first intermediate material layer IMD1a' may include forming an insulating layer filling the opening 33' and covering the second intermediate material layer IMD2a', and planarizing the insulating layer until an upper surface of the second intermediate material layer IMD2a' is exposed. The planarization may be performed through a chemical mechanical polishing process.

The first intermediate material layer IMD1a' may be formed of a material having a dielectric constant that is higher than that of the second intermediate material layer IMD2a'.

In an implementation, the first intermediate material layer IMD1a' may be formed of, e.g., silicon oxide, and the second intermediate material layer IMD2a' may be formed of, e.g., a low dielectric material having a dielectric constant lower than that of silicon oxide.

In an implementation, the first intermediate material layer IMD1a' may be formed of, e.g., TetraEthylOrthoSilicate (TEOS) oxide, and the second intermediate material layer IMD2a' may be formed of, e.g., SiOCH or SiOC, having a lower dielectric constant than TEOS oxide.

The material of the first intermediate material layer IMD1a' and the material of the second intermediate material layer IMD2a' may be low dielectric materials having a dielectric constant lower than 3.9. In an implementation, the first intermediate material layer IMD1a' may be formed of, e.g., a first low-dielectric material, and the second intermediate material layer IMD2a' may be formed of, e.g., a second low-dielectric material having a dielectric constant that is lower than that of the first low dielectric material.

The first intermediate material layer IMD1a' and the second intermediate material layer IMD2a' may constitute an intermediate insulating layer 34'. The intermediate insulating layer 34' and the intermediate etch-stop layer 32' may constitute an intermediate insulating structure 30'.

Referring to FIGS. 1 and 12C, the intermediate interconnection structure 40, as illustrated in FIG. 11E, may be formed in the intermediate insulating structure 30', in the same manner as in FIGS. 11D and 11E. In an implementation, an interconnection trench in the first intermediate material layer IMD1a' and an opening including a via-hole penetrating through the first intermediate material layer IMD1a' below the interconnection trench and the first portion 32a' of the intermediate etch-stop layer 32' may be formed, and the intermediate interconnection structure 40 may be formed in the opening.

An upper insulating structure 46 may be formed on the intermediate insulating structure 30' and the intermediate interconnection structure 40. The upper insulating structure 46 may include an upper etch-stop layer 48 and an upper insulating layer 50, sequentially stacked.

The upper insulating layer 50 may be formed of a material having a dielectric constant that is higher than that of the second intermediate material layer IMD2a'. The upper insulating layer 50 may be formed of the same material as the first intermediate material layer IMD1a'. In an implementation, the upper insulating layer 50 may be formed of, e.g., TetraEthylOrthoSilicate (TEOS) oxide.

An upper conductive pattern 53 penetrating through the upper insulating structure 46 and electrically connected to the intermediate interconnection structure 40 may be formed. The upper conductive pattern 53 may include a plug pattern 53b and a barrier layer 53a covering a side surface and a bottom surface of the plug pattern 53b.

Referring to FIGS. 1 and 6, a conductive material layer may be formed on the upper insulating structure 46, and the conductive material layer may be patterned so that an upper interconnection 56 electrically connected to the upper conductive pattern 53 may be formed.

In the above-described example embodiments, the intermediate interconnection structure 40 may be formed in the first intermediate material layers IMD1a and IMD1a', formed of a material having greater hardness, among the first intermediate material layers IMD1a and IMD1a' and the second intermediate material layers IMD2a and IMD2a', so that the intermediate interconnection structure 40 can be formed stably and reliably without defects.

In the above-described example embodiments, the intermediate interconnection structure 40 may be formed in plural, and may form the second intermediate material layers IMD2a and IMD2a' having a low-dielectric material having a lower dielectric constant, among the first intermediate material layers IMD1a and IMD1a' and the second intermediate material layers IMD2a and IMD2a' between the intermediate interconnection structures 40, adjacent to each other, so that parasitic capacitance between the intermediate interconnection structures 40 may be reduced. Accordingly, by reducing RC delay in the intermediate interconnection structures 40, electrical performance of the semiconductor device may be improved.

In the above-described example embodiments, the upper conductive pattern 53 may be formed to be spaced apart from the second intermediate material layers IMD2a and IMD2a'. It is possible to help prevent defects due to interfacial separation between the upper conductive pattern 53 and the second intermediate material layers IMD2a and IMD2a' formed of a low dielectric material.

As set forth above, according to example embodiments, it is possible to provide a semiconductor device including an insulating structure including first and second material layers having different dielectric constants and an interconnection structure in the insulating structure. The interconnection structure may be in a first material layer having a relatively high dielectric constant among the first and second material layers, and the second material layer may be formed of a low dielectric material having a low dielectric constant. When the plurality of interconnection structures are provided, the second material layer formed of a low dielectric may be between the interconnection structures, to help reduce parasitic capacitance between the interconnections, thereby reducing RC delay of the interconnections. Accordingly, the performance of the semiconductor device can be improved.

In some example embodiments, the interconnection structure may be formed in a first material layer having a higher dielectric constant and having hardness higher than the second material layer, thereby stably and reliably forming the interconnection structure.

By way of summation and review, as semiconductor devices are highly integrated, interconnection defects could occur while interconnections are formed in the interlayer insulating layer of a low dielectric.

According to example embodiments, an upper conductive pattern may be on the interconnection structure. The upper conductive pattern may be spaced apart from the second material layer having a relatively low dielectric constant among the first and second material layers. Accordingly, it is possible to help prevent defects due to interfacial delamination between the upper conductive pattern and the second material layer having a low dielectric constant.

One or more embodiments may provide a semiconductor device including an interconnection structure having reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure;
an intermediate insulating structure on the lower structure;
an intermediate interconnection structure penetrating through the intermediate insulating structure;
an upper insulating structure on the intermediate insulating structure and the intermediate interconnection structure; and
an upper conductive pattern penetrating through the upper insulating structure and electrically connected to the intermediate interconnection structure,
wherein:
the intermediate insulating structure includes an intermediate etch-stop layer and an intermediate insulating layer on the intermediate etch-stop layer,
the intermediate insulating layer includes a first intermediate material layer and a second intermediate material layer, the second intermediate material layer having an upper surface coplanar with an upper surface of the first intermediate material layer,
the intermediate interconnection structure penetrates through the first intermediate material layer and the intermediate etch-stop layer,
a material of the first intermediate material layer has a dielectric constant that is higher than a dielectric constant of a material of the second intermediate material layer,
the intermediate interconnection structure includes an interconnection portion and a via portion,
the first intermediate material layer covers a lower surface and a side surface of the interconnection portion, and
the via portion extends downwardly from a portion of the lower surface of the interconnection portion and penetrates through the first intermediate material layer and the intermediate etch-stop layer below the interconnection portion.

2. The semiconductor device as claimed in claim 1, wherein:

the intermediate interconnection structure includes an intermediate interconnection material layer and an intermediate barrier material layer, the intermediate barrier material layer covering a side surface and a bottom surface of the intermediate interconnection material layer, and the upper conductive pattern includes a material that is different from a material of the intermediate interconnection material layer.

3. The semiconductor device as claimed in claim 2, wherein:

the intermediate interconnection material layer includes copper, and the upper conductive pattern includes tungsten.

4. The semiconductor device as claimed in claim 1, wherein:

the intermediate interconnection structure includes an intermediate interconnection material layer and an intermediate barrier material layer, the intermediate barrier material layer covering a side surface and a lower surface of the intermediate interconnection material layer, the intermediate interconnection material layer has an upwardly convex upper surface, and the intermediate barrier material layer includes a protruding portion extending upwardly at the side surface of the intermediate interconnection material layer.

5. The semiconductor device as claimed in claim 1, wherein the upper conductive pattern is:

in contact with the intermediate interconnection structure, and spaced apart from the second intermediate material layer.

6. The semiconductor device as claimed in claim 5, wherein:

the upper insulating structure includes an upper etch-stop layer and an upper insulating layer on the upper etch-stop layer, and a material of the upper insulating layer is different from the material of the second intermediate material layer.

7. The semiconductor device as claimed in claim 6, wherein the material of the upper insulating layer has a dielectric constant that is higher than the dielectric constant of the material of the second intermediate material layer.

8. The semiconductor device as claimed in claim 6, wherein:

the lower structure includes:

a lower etch-stop layer and a lower insulating structure on the lower etch-stop layer; and a lower interconnection structure penetrating through the lower insulating structure, the lower insulating structure is in contact with a side surface of the lower interconnection structure, and a material of the lower insulating structure has a dielectric constant that is lower than the dielectric constant of the material of the first intermediate material layer.

9. The semiconductor device as claimed in claim 6, wherein:

the lower structure includes a lower insulating structure and a lower interconnection structure, the lower interconnection structure penetrating through the lower insulating structure, the lower insulating structure includes a lower etch-stop layer and a lower insulating layer on the lower etch-stop layer, the lower insulating layer includes a first lower material layer and a second lower material layer, the second lower material layer having an upper surface coplanar with an upper surface of the first lower material layer, the lower interconnection structure penetrates through the first lower material layer and the lower etch-stop layer, and a material of the first lower material layer has a dielectric constant that is higher than a dielectric constant of a material of the second lower material layer.

10. The semiconductor device as claimed in claim 1, wherein the lower structure further includes a transistor including a gate structure and source/drain regions.

11. The semiconductor device as claimed in claim 10, wherein the lower structure further includes a data storage structure on a higher level than the transistor.

12. The semiconductor device as claimed in claim 1, wherein:

the material of the first intermediate material layer includes silicon oxide, the material of the second intermediate material layer includes a low-κ dielectric material, and the low-κ dielectric material has a dielectric constant that is lower than a dielectric constant of the silicon oxide.

13. A semiconductor device, comprising:

a lower structure;

a first etch-stop layer on the lower structure, the first etch-stop layer having a first portion and a second portion;

a first material layer on an upper surface of the first portion of the first etch-stop layer;

a second material layer on an upper surface of the second portion of the first etch-stop layer;

an interconnection structure penetrating through the first material layer and the first portion of the first etch-stop layer;

a second etch-stop layer on an upper surface of the first material layer, an upper surface of the second material layer, and an upper surface of the interconnection structure;

an upper insulating layer on an upper surface of the second etch-stop layer; and an upper conductive pattern penetrating through the upper insulating layer and the second etch-stop layer and electrically connected to the interconnection structure, wherein:

a minimum thickness in a vertical direction of the first portion of the first etch-stop layer is different from a minimum thickness in the vertical direction of the second portion of the first etch-stop layer, the first material layer includes silicon oxide, the second material layer includes a low-κ dielectric material, and the low-κ dielectric material has a dielectric constant that is lower than a dielectric constant of the silicon oxide.

14. The semiconductor device as claimed in claim 13, wherein the minimum thickness of the first portion is greater than the minimum thickness of the second portion.

15. The semiconductor device as claimed in claim 13, wherein the minimum thickness of the first portion is smaller than the minimum thickness of the second portion.

16. The semiconductor device as claimed in claim 13, further comprising an upper interconnection electrically connected to the upper conductive pattern on the upper insulating layer, wherein:

the interconnection structure includes an interconnection portion and a via portion, the via portion extending downwardly from the interconnection portion, the first material layer covers a lower surface and a side surface of the interconnection portion, the via portion penetrates through the first material layer and the first etch-stop layer below the interconnection portion, the interconnection structure includes copper, the upper conductive pattern includes a first conductive material that does not include copper, and the upper interconnection includes a second conductive material that does not include copper.

17. The semiconductor device as claimed in claim 13, wherein the upper conductive pattern is spaced apart from the second material layer.

18. A semiconductor device, comprising:

a first lower insulating structure;

a first lower interconnection structure penetrating through the first lower insulating structure;

a second lower insulating structure on the first lower insulating structure and the first lower interconnection structure;

a second lower interconnection structure penetrating through the second lower insulating structure;

an intermediate insulating structure on the second lower insulating structure and the second lower interconnection structure;

an intermediate interconnection structure penetrating through the intermediate insulating structure;

an upper insulating structure on the intermediate insulating structure and the intermediate interconnection structure; and an upper conductive pattern penetrating through the upper insulating structure, wherein:

the intermediate insulating structure includes an intermediate etch-stop layer and an intermediate insulating layer on the intermediate etch-stop layer, the intermediate insulating layer includes a first intermediate material layer covering a first portion of the intermediate etch-stop layer and a second intermediate material layer, the second intermediate material layer having an upper surface coplanar with an upper surface of the first intermediate material layer, the intermediate etch-stop layer includes the first portion in contact with the first intermediate material layer, and a second portion in contact with the second intermediate material layer, the intermediate interconnection structure penetrates through the first intermediate material layer and the intermediate etch-stop layer and is electrically connected to the second lower interconnection structure, a minimum thickness in a vertical direction of the first portion of the intermediate etch-stop layer is different from a minimum thickness in the vertical direction of the second portion of the intermediate etch-stop layer, the first intermediate material layer includes silicon oxide, the second intermediate material layer includes a low-κ dielectric material, and the low-κ dielectric material has a dielectric constant that is lower than a dielectric constant of the silicon oxide.

19. The semiconductor device as claimed in claim 18, further comprising:

a word line;

a bit line; and a data storage structure, wherein the word line, the bit line, and the data storage structure are on a level that is lower than a level of the first lower insulating structure.

20. The semiconductor device as claimed in claim 18, wherein:

the upper insulating structure includes an upper etch-stop layer and an upper insulating layer on the upper etch-stop layer, the upper conductive pattern penetrates through the upper insulating layer and the upper etch-stop layer, and the upper conductive pattern is spaced apart from the second intermediate material layer.

* * * * *